United States Patent
Weng et al.

(10) Patent No.: US 7,278,085 B1
(45) Date of Patent: Oct. 2, 2007

(54) SIMPLE ERROR-CORRECTION CODES FOR DATA BUFFERS

(75) Inventors: Lih-Jyh Weng, Shrewsbury, MA (US); Bruce Buch, Westborough, MA (US)

(73) Assignee: Maxtor Corporation, Longmont, CO (US)

(*) Notice: Subject to any disclaimer, the term of this patent is extended or adjusted under 35 U.S.C. 154(b) by 329 days.

(21) Appl. No.: 10/608,320

(22) Filed: Jun. 27, 2003

Related U.S. Application Data

(60) Provisional application No. 60/452,416, filed on Mar. 6, 2003.

(51) Int. Cl.
*G11C 29/00* (2006.01)

(52) U.S. Cl. .................. 714/766; 714/801

(58) Field of Classification Search ........... 714/805, 714/766, 801
See application file for complete search history.

(56) References Cited

U.S. PATENT DOCUMENTS

| | | | | |
|---|---|---|---|---|
| 4,862,462 A | * | 8/1989 | Zulian | 714/758 |
| 5,452,429 A | * | 9/1995 | Fuoco et al. | 714/6 |
| 5,490,155 A | * | 2/1996 | Abdoo et al. | 714/763 |
| 5,537,425 A | * | 7/1996 | Tsou | 714/805 |
| 5,555,250 A | * | 9/1996 | Walker et al. | 714/763 |
| 5,612,965 A | * | 3/1997 | Michaelson | 714/800 |
| 5,663,969 A | * | 9/1997 | Tsou | 714/805 |
| 5,666,371 A | * | 9/1997 | Purdham | 714/763 |
| 5,784,393 A | * | 7/1998 | Byers et al. | 714/800 |
| 6,799,291 B1 | * | 9/2004 | Kilmer et al. | 714/722 |

* cited by examiner

*Primary Examiner*—Guy Lamarre
*Assistant Examiner*—Mujtaba K. Chaudry
(74) *Attorney, Agent, or Firm*—Cesari and McKenna, LLP

(57) ABSTRACT

A method of and apparatus for handling errors occurring in data stored in memory is presented. Data to be stored in a buffer memory is applied to a generator matrix to generate parity check bits. The parity check bits are stored in the buffer memory along with the data. The stored data and parity check bits are read and the read data is used to regenerate the parity check bits. A result produced from the stored and regenerated parity check bits is usable to directly identify a location of an erroneous bit of the data in the buffer memory.

27 Claims, 12 Drawing Sheets

```
unsigned encode()
{   Int M = 14;
    unsigned result;
    unsigned syndrome_x_0, syndrome_x_1, syndrome_x_5;
    int i,j;
    unsigned parity_on_parity;
    unsigned position; // The value of position starts at 1 and ends at 2^14 - 1.
    syndrome_x_0 = 0;
    syndrome_x_1 = 0;
    syndrome_x_5 = 0;
    for(i=0; i < CODE_LENGTH_IN_LONG_WORD; i++) {
        for (j = 0; j <32; j++)     {
            if(p_temp[i] & (1<<j)) {
                syndrome_x_0^ = 1;
                position = (unsigned) i*32 + j + 1;
                syndrome_x_1^ = add_parity(position);
                syndrome_x_5^ = add_parity(fifth_power(position));
            }
        }
    }
    parity_on_parity = syndrome_x_0^ (syndrome_x_1 & 1) ^ (syndrome_x_5 & 1);

result = 0;
    result ^ = syndrome_x_5 << (30-M);    // bits 16 - 30
    result ^ = syndrome_x_1 << (29-M-M);  // bits 1 - 15
    result ^ = syndrome_x_0 << 1;         // bit 31
    result ^ = parity_on_parity;          // bit 0 return(result);
}
```

*FIG. 13*

SIMPLE ERROR-CORRECTION CODES FOR DATA BUFFERS

CROSS REFERENCE TO RELATED APPLICATIONS

This application claims priority from U.S. Provisional Patent Application No. 60/452,416, filed Mar. 6, 2003, which is incorporated herein by reference in its entirety for all purposes.

BACKGROUND

The invention relates to encoding and decoding techniques for error correction and detection.

In conventional data storage systems, data being transferred between a processor and a storage device (such as a hard disk) is buffered in memory. Typically, the buffer memory is implemented with semiconductor memory devices such as Dynamic Random Access Memory (DRAM) devices.

Semiconductor memory devices, in particular, DRAMs, are susceptible to errors known as "soft errors". Soft errors are unexpected or unwanted changes in the value of a bit (or bits) somewhere in the memory. One bit may suddenly, randomly change state, or noise may get stored as if it were valid data. Soft errors are caused by external factors, such as terrestrial cosmic rays.

When soft errors go undetected in a data storage system, erroneous data may be written to disk, or good data read back can be corrupted before it is sent to the processor. In order to provide an acceptable level of reliability for data read from a memory array, therefore, error correcting codes (ECC) such as linear block codes have been employed to correct bit errors in the data stored in the memory. For example, Hamming codes have been used to provide single-bit error correction and double-bit error detection to preserve the data accuracy. As more than two errors cannot be properly detected by the Hamming code, often a Cyclic Redundancy Check (CRC) code is used to supplement the detection capability of the Hamming code. The CRC has no error correction capability, but can detect errors occurring in more than two bits at a time. Together, the Hamming check and CRC can correct single bit errors and detect multi-bit errors reliably.

Conventional linear block codes such as Hamming codes are efficient and easily implemented by using linear feedback shift registers as encoders. During decoding, however, the error locations are indicated by syndromes, which need to be mapped to the actual locations of the errors in the buffer memory. One common approach to this task is to use a large table, which maps the syndromes to the actual memory locations of the errors. The use of such a lookup table incurs additional complexity and cost.

SUMMARY

This invention features a coding technique that produces a syndrome that directly points to the memory location of an erroneous data word so that no syndrome conversion is needed.

In one aspect of the invention, a method of decoding errors occurring in data stored in memory includes: (i) applying data to be stored in a buffer memory to a generator matrix to generate parity check bits; (ii) storing the parity check bits in the buffer memory following the data; (iii) reading the stored data and parity check bits; (iv) re-generating the parity check bits; and (v) producing from the stored and re-regenerated parity check bits a syndrome of a form that is usable to directly identify a location of an erroneous bit of the data in the buffer memory.

In another aspect of the invention, an apparatus includes a controller coupled to a storage medium and a buffer memory coupled to the controller for storing data to be written to the storage medium and data read from the storage medium. The controller is operable to perform the following steps: (i) applying data to be stored in a buffer memory to a generator matrix to generate parity check bits; (ii) storing the parity check bits in the buffer memory following the data; (iii) reading the stored data and parity check bits; (iv) regenerating the parity check bits; and (v) producing from the stored and regenerated parity check bits a result that is usable to directly identify a location of an erroneous bit of the data in the buffer memory.

Other features and advantages of the invention will be apparent from the following detailed description, and from the claims.

BRIEF DESCRIPTION OF THE DRAWINGS

FIG. 13 is a C-code representation of a 32-bit embodiment of the parity check bit generator (of FIG. 2) that implements parity check generation based on the generator matrix of FIG. 12.

Like reference numerals will be used to represent like elements.

DETAILED DESCRIPTION

Figure 1:
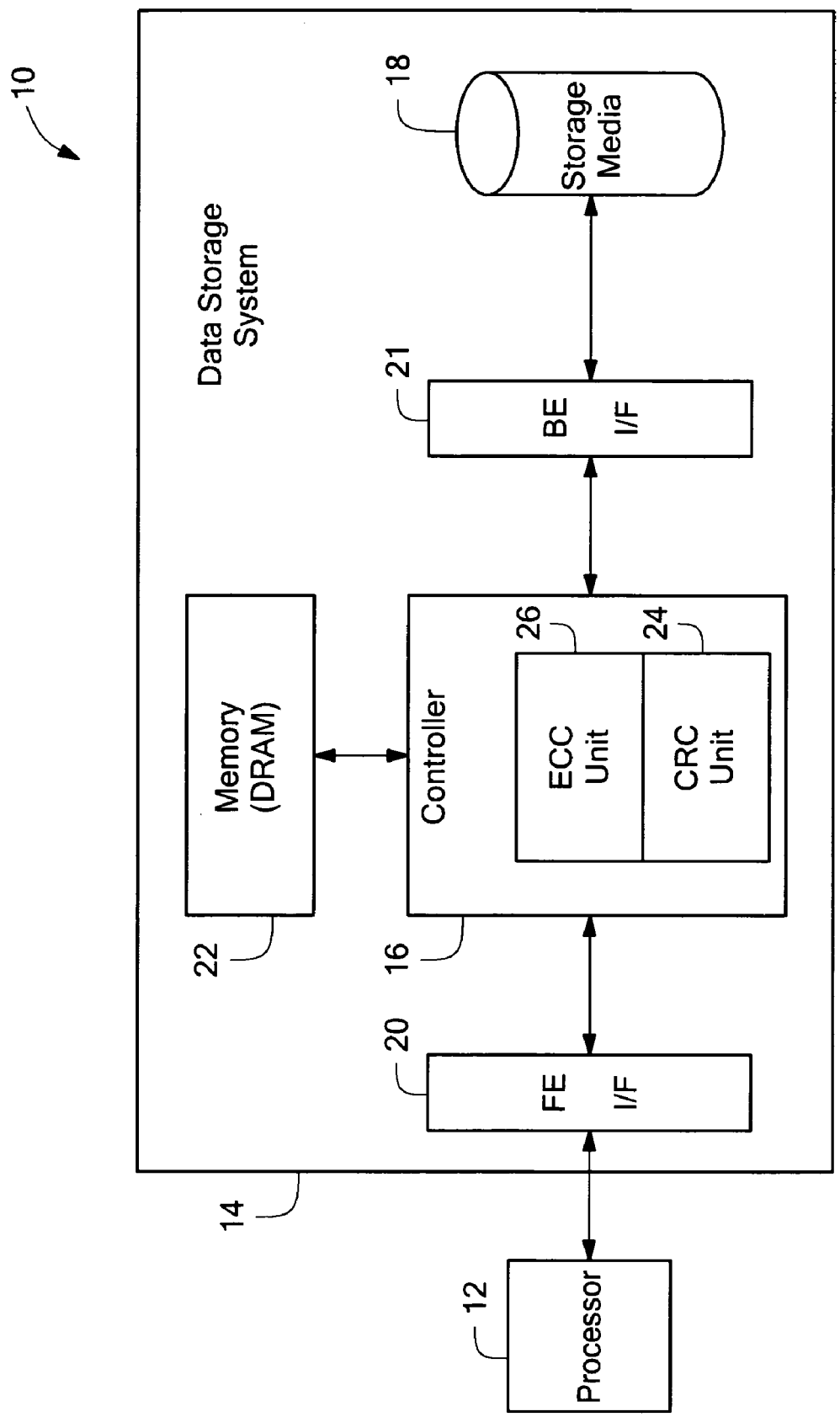
FIG. 1 shows a block diagram of a data storage system that employs an error correcting code (ECC) unit encoder that produces error syndromes that directly identify error locations in buffer memory.

Referring to FIG. 1, an exemplary data processing system 10 is shown. The data processing system 10 includes a processor 12 coupled to an I/O system 14. The I/O system 14 includes a controller 16 coupled to an I/O device 18. In one embodiment, as illustrated in the figure, the I/O system 14 is a data storage system 14 and the I/O device includes storage media 18, as shown. The storage media 18 can be a hard disk unit or some other type of mass storage. Alternatively, the controller 16 could be connected to some other type of I/O device, for example, a network device such as a transceiver that transmits and receives data over a network.

In the illustrated embodiment, the data storage system 14 includes a front end (FE) interface 20 that interfaces the controller 16 to the processor 12, a back end (BE) interface 21 that interfaces the controller 16 to the storage media 18 and a buffer memory 22, which serves as a staging area for data being transferred between the processor 12 and the storage media 18 via the two interfaces 20, 21. In one embodiment, the buffer memory 22 is implemented as Dynamic Random Access Memory (DRAM) which, as discussed above, may be particularly vulnerable to single- and multi-bit error occurrences.

In one exemplary embodiment, the controller 16 is configured to support coding to ensure the integrity of the data that is stored in the buffer memory 22. In particular, the coding includes error correction coding (ECC). The ECC is in the form of a linear block code that, in one embodiment, is similar to a Hamming code, and in another embodiment, is similar to a BCH code, as will be discussed later. For additional error detection capability, and as shown, the controller 16 may support Cyclic Redundancy Check (CRC) coding as well.

Data to be written to the storage media 18 is provided to the FE interface 20, which provides the data to a CRC unit 24 and ECC unit 26 via bus 28. The CRC unit 24 and ECC unit 26 compute CRC checks and ECC checks, respectively, for the received data. The checks are appended to the data. The data and the checks are stored in the buffer memory 22. When the data is read from the buffer memory 22 for transfer to the disk unit 18, the checks are re-computed for error detection and correction, as will be described.

Similarly, when data is moved from the storage media 18 to the processor 12, the data is provided to the controller 16 by the storage media 18 via the BE interface 21. The data is again stored in the buffer memory 22 temporarily. As before, checks are computed and stored along with the data in the buffer memory, and then re-computed when the data is read from the buffer memory 22 for transfer to the processor 12 via the FE interface 20.

The exemplary data storage system 14 as thus described with reference to FIG. 1 is intended to illustrate only those aspects of the storage system 14 which pertain to encoding and decoding of buffered data. Hence, some functions are omitted and others simplified to a level appropriate to a discussion of the encoding and decoding processes as follows.

As is well known in the art, Extended Hamming codes allow the correction of single bit errors and detection of two bit errors per each unit of data plus associated parity check, called a "code word". This is accomplished by using more than one parity bit, each computed on different combinations of bits in the data. The number of parity check bits required is given by the Hamming rule and is a function of the number of bits of data transmitted. The Hamming rule is expressed by the following $k+p+2 \leq 2^p$ where k is the number of data bits and p is the number of parity check bits.

In one embodiment, as illustrated in and described with reference to FIGS. 3-11, the ECC utilized by the encoding and decoding mechanisms of the present invention is similar to the Extended Hamming code in some aspects. Unlike the conventional Hamming code and Extended Hamming code, which has a length of $2^p-1$ bits, inclusive of both data and parity check bits (p for Hamming code and p+1 for Extended Hamming code), however, the code described herein appends the parity check bits to $2^p-1$ data bits for a code length of $(2^p-1)$ plus the number of parity check bits, e.g., p+1 or p+2.

As with the conventional Hamming and Extended Hamming codes, the ECC code word of the illustrated embodiments is generated by multiplying the data bits by a generator matrix G using modulo-2 arithmetic. For an (n,k) code having an n-bit code word with k-bits of data followed by "n-k" parity check bits, the (n,k) code is described by a k×n generator matrix G and by an "n-k" × n parity check matrix H. The resulting code word vector $(c_1, c_2, c_3, \ldots, c_n)$, includes the original data bits 'd' and the calculated parity bits 'p'. Hamming weight is the number of non-zero bits in a binary n-tuple. The Hamming distance is the number of bits in which two binary n-tuples differ.

The generator matrix G used in constructing the ECC consists of an identity matrix I and a parity generation matrix P: $G=[I_k P]$. The P partition of G is responsible for the generation of the actual parity check bits. Each column in P represents one parity check bit calculation computed on a subset of data d. Validating the received code word r (in the illustrated embodiment, the received code word is the code word as read from the buffer memory 22) involves multiplying it by the parity check matrix to form a syndrome vector "s". That is, where parity matrix $H=[P^T I_{n-k}]$, syndrome $s=H*r^T$. If all elements of s are zero, the code word was received correctly. Typically, if s contains non-zero elements, the bit in error can be corrected as long as the error involves only a single bit.

Still referring to FIG. 1, the ECC unit 26 uses an ECC to generate an "n-k"-bit parity check from a k-bit data vector. In the illustrated embodiment, $k=2^{14}$ and "n-k" is 14; however, parity checks and data vectors of other sizes may be used. The parity check is stored along with the data vector during the buffer memory write cycle. During the buffer memory read cycle, all of memory words of the code word c are read back from the buffer memory 22 as code word r, and are processed to determine if an error has occurred in the code word.

Figure 2:
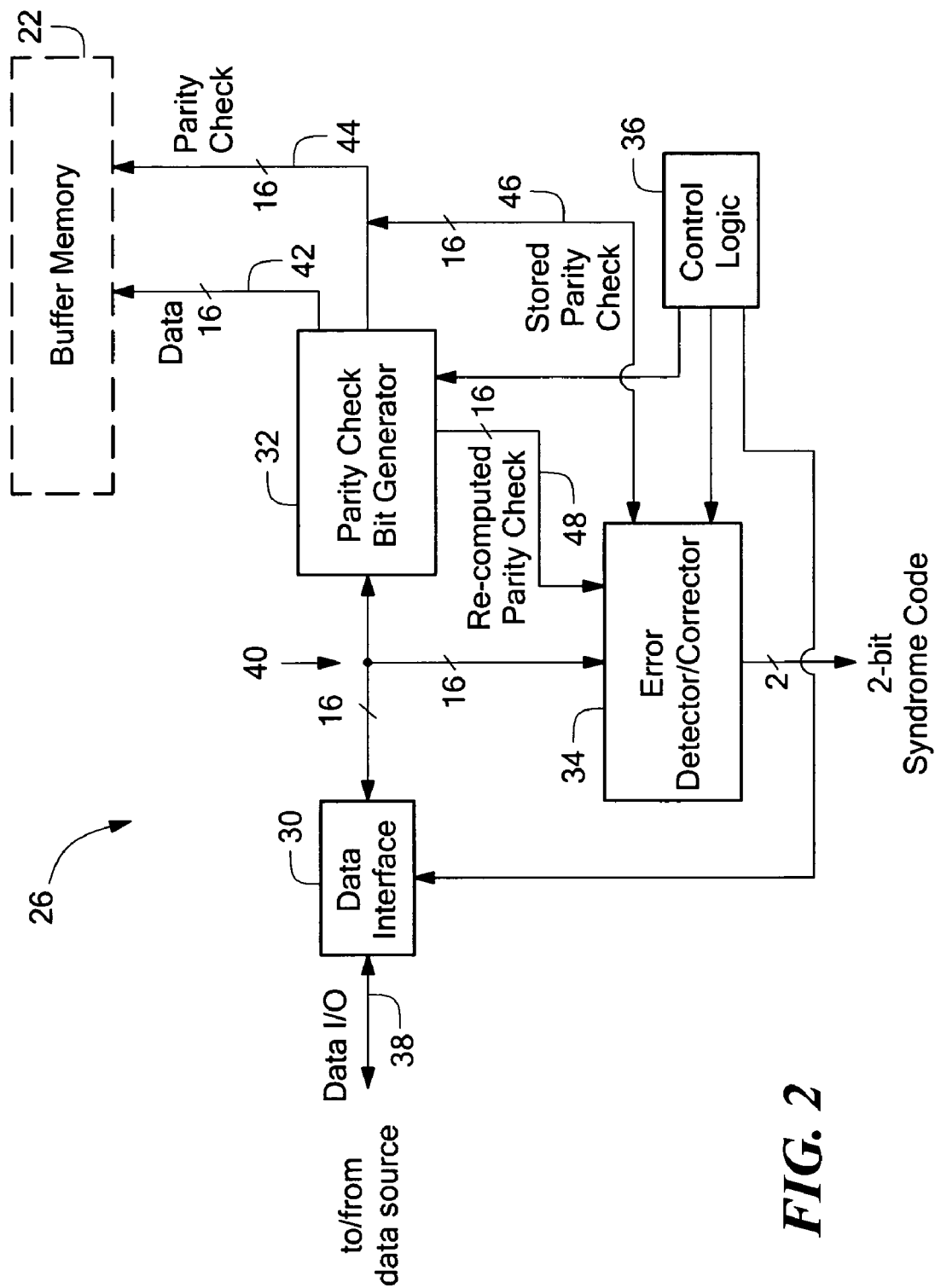
FIG. 2 is a block diagram of the ECC unit (shown in FIG. 1) having a parity check bit generator used during encoding and decoding, and an error detector/corrector (EDC) used during decoding.

Referring to FIG. 2, the ECC unit 26 includes the following functional units: a data interface 30, a parity check bit generator 32, an error detector/corrector (EDC) 34 and a control logic block 36. During a buffer memory write operation, a vector of data from a data source (e.g., the processor 12 in the case of disk writes, or the storage media 18 in the case of disk reads) is received by the data interface 30 over a data I/O bus 38 and then provided to the parity check bit generator 32 via data interconnect 40. In the illustrated embodiment of the ECC unit 26, the vector of data is $2^{14}$ bits in length and is transferred 16-bit words at a time. As the data is received by the parity check bit generator 32, the parity check bit generator 32 generates parity check bits for the data vector. Both the data words of the data vector and the parity check bits associated with the data vector are then written to the buffer memory 22 via data memory bus 42 and parity check memory bus 44, respectively. During a buffer memory read operation, the data vector and associated parity check that were stored in the buffer memory 22, now possibly in error, are retrieved from the buffer memory over the bus lines 42 and 44. Parity check bits are re-computed for the data vector by the parity check bit generator 32. The stored parity check, which has been read from buffer memory, is provided to the EDC 34 via a first parity check bus 46 and the re-computed parity check bits are provided to the EDC 34 over a second parity check bus 48. The EDC 34 also receives the data vector via the interconnect 40. The EDC 34 compares, by an EXCLUSIVE-OR ("XOR") operation, the re-computed parity check bits with the original parity check bits that were stored in the buffer memory 22. The XOR of the stored parity check bits with the re-computed parity check bits produces a syndrome. The syndrome is analyzed for error detection and correction possibilities. The EDC 34 applies the appropriate error correction, as necessary, as well as providing error flags to the processor 12 in the form of a two-bit syndrome code, as will be explained below.

Figure 9A:
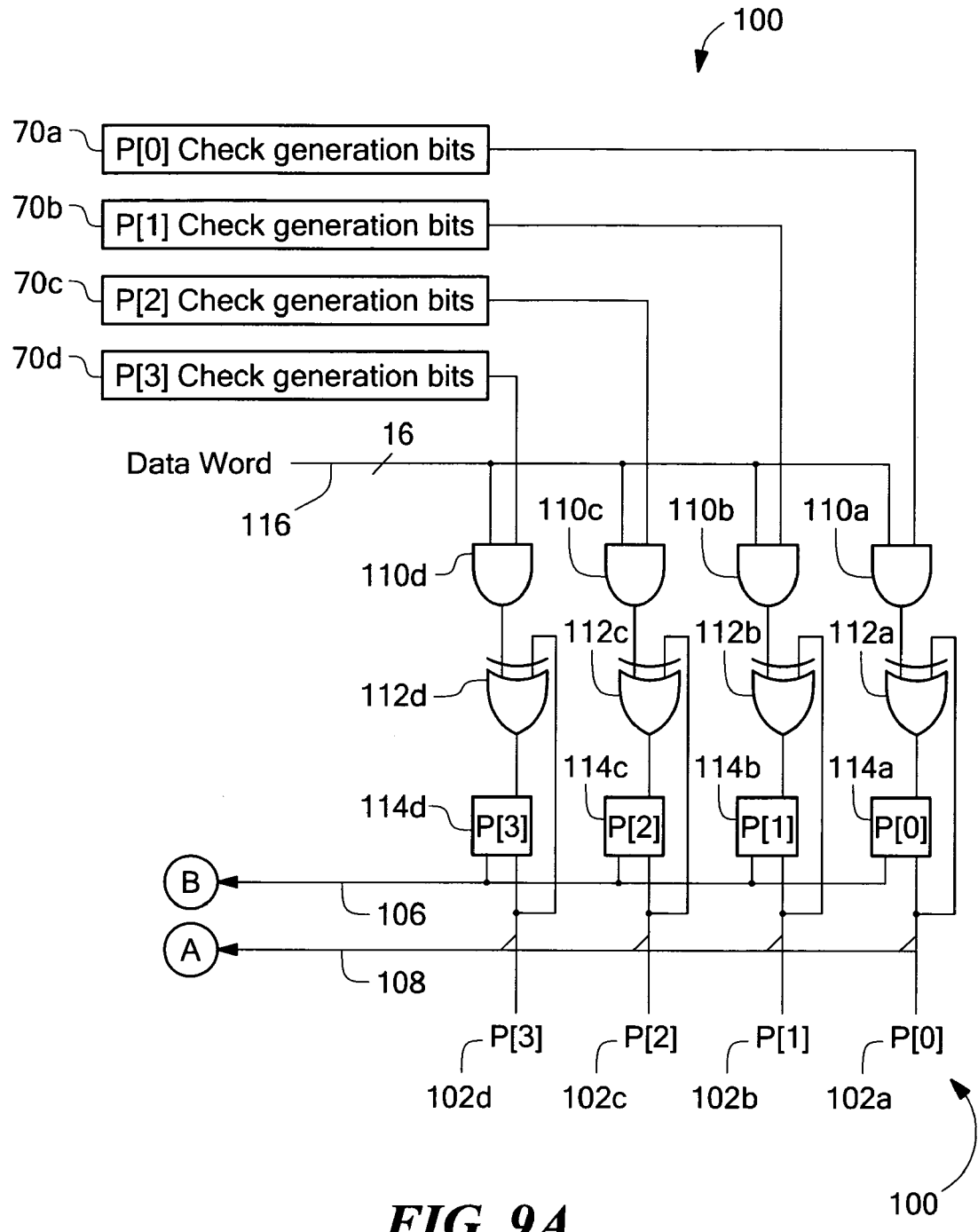
FIGS. 9A and 9B collectively show a schematic diagram of an exemplary 16-bit embodiment of the parity check bit generator (of FIG. 2) that implements parity check generation based on the generator matrix of FIG. 7.
Figure 9B:
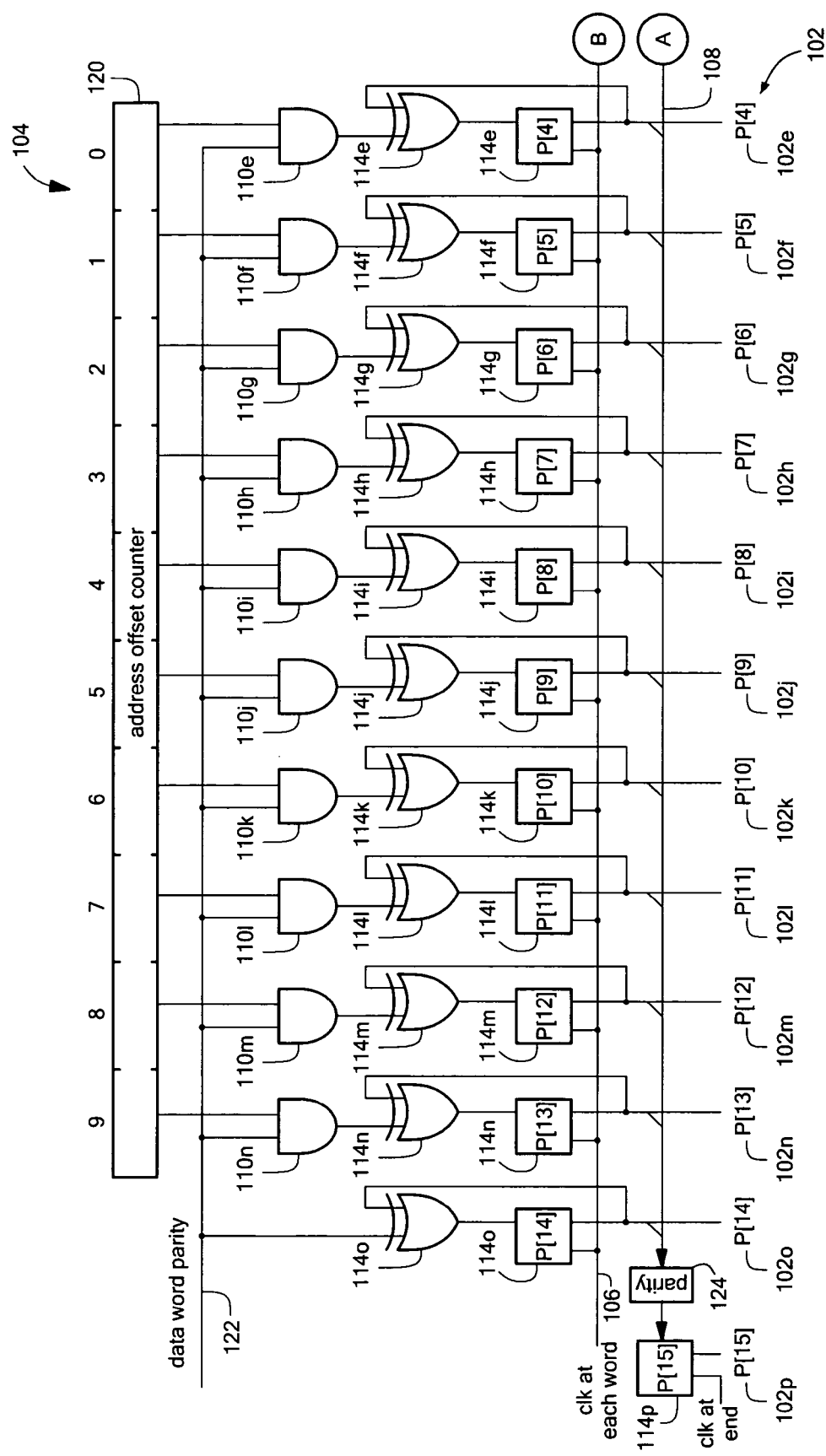

The embodiment of the ECC unit 26 shown in FIG. 2, as well as FIGS. 9A-9B, and the buffer memory organization are based on a 16-bit word implementation. However, it will be appreciated that, as word size is a matter of design choice, other word sizes may be used.

Figure 3:
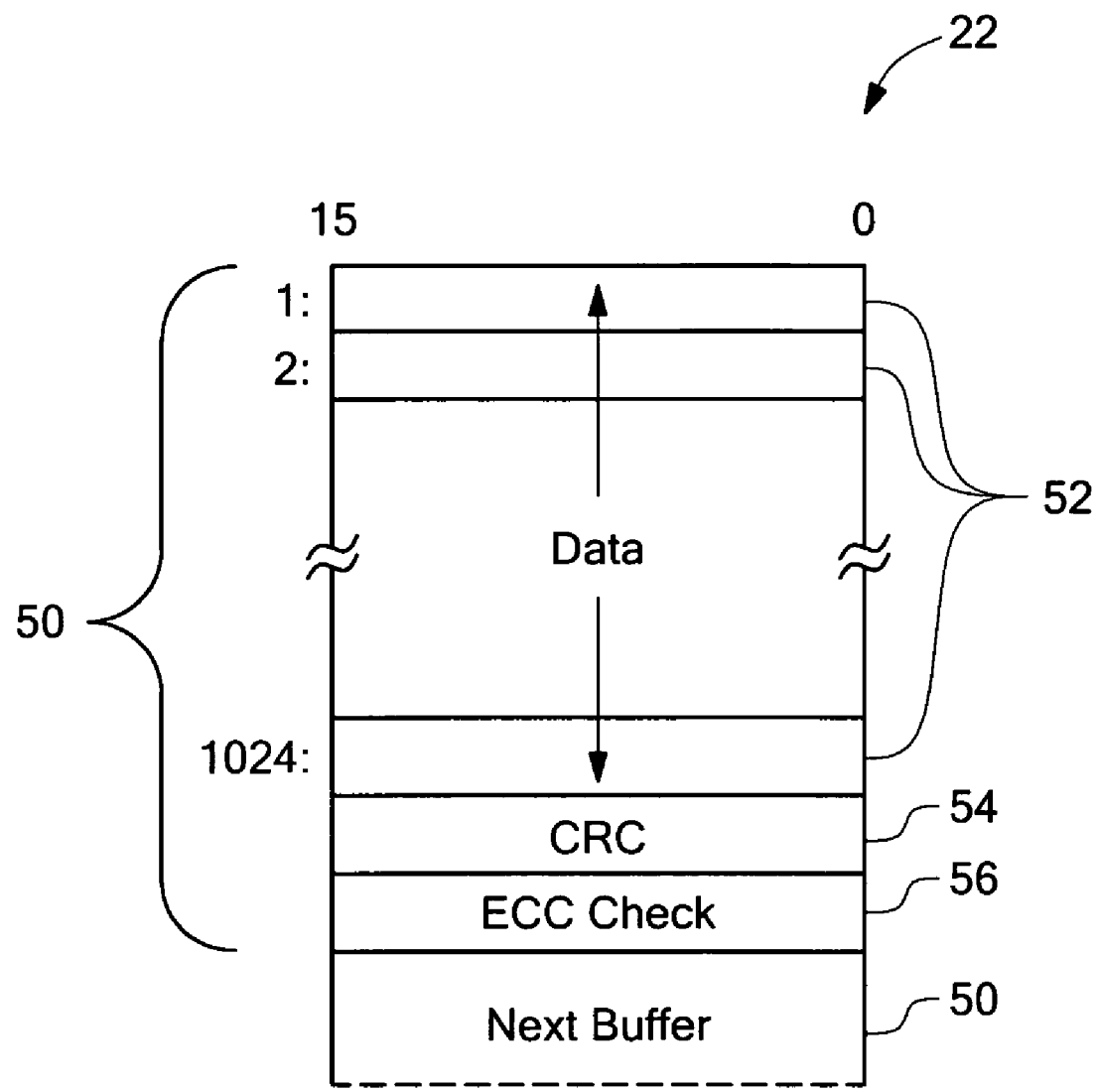
FIG. 3 is a depiction of memory buffers, each of which stores a block of data followed by a CRC check and ECC check computed for the data during encoding.

Referring to FIG. 3, the buffer memory 22, shown only in partial view, includes a plurality of buffers 50, each having a number of buffer locations 52 for storing all 16-bit words of the data vector. The illustrated embodiment assumes a payload of 1024 16-bit words (2048-bytes of data buffer) plus 2 bytes of CRC. The ECC check occupies the $1026^{th}$ word of each buffer. The CRC check and ECC check computed for data stored in the buffer locations 52 are stored in check buffer locations 54 and 56, respectively.

Figure 4:
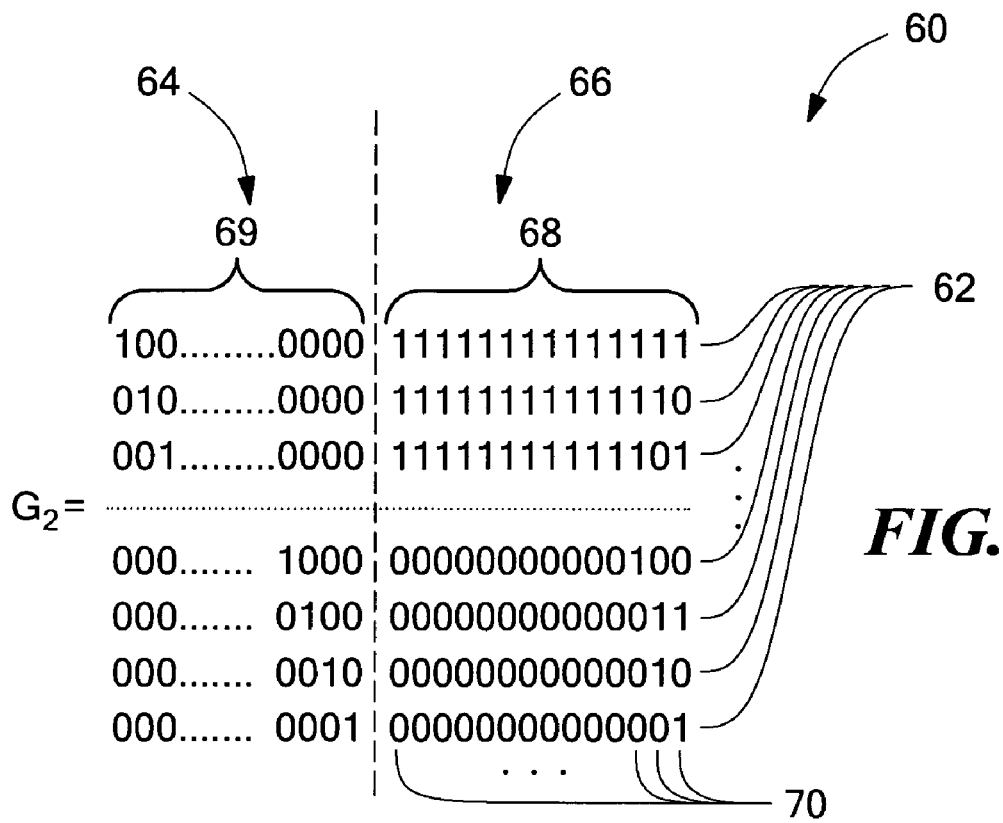
FIG. 4 is a depiction of a generator matrix with a Hamming distance of two.

Referring to FIG. 4, a generator matrix ("$G_2$") 60 of k rows 62 by n columns (that is, k×n elements) is given. In the illustrated embodiment, k is equal to '$2^{14}-1$' (number of matrix rows 62) and n is equal to '$2^{14}-1+14$' (number of matrix columns). The matrix 60 includes a k×k element data portion 64 and a k×14 redundancy portion 66. The elements of each row 62 in each redundancy portion 66, denoted by reference number 68, form a binary representation of a count corresponding to the position of data in the buffer, that is, the buffer locations. The elements in each row in the data portion are indicated by reference number 69. Columns 70 of the redundancy portion 66 of the generator matrix 60 are used to generate the parity check bits by selecting different combinations of data bits and generating parity from them. Thus, bits in each of the columns 70 are referred to herein as "parity generation bits".

It can be seen from the figure that the minimum Hamming distance of the code is 2. As is known, the minimum distance of a Hamming code should be at least three in order to correct a single error.

Figure 5:
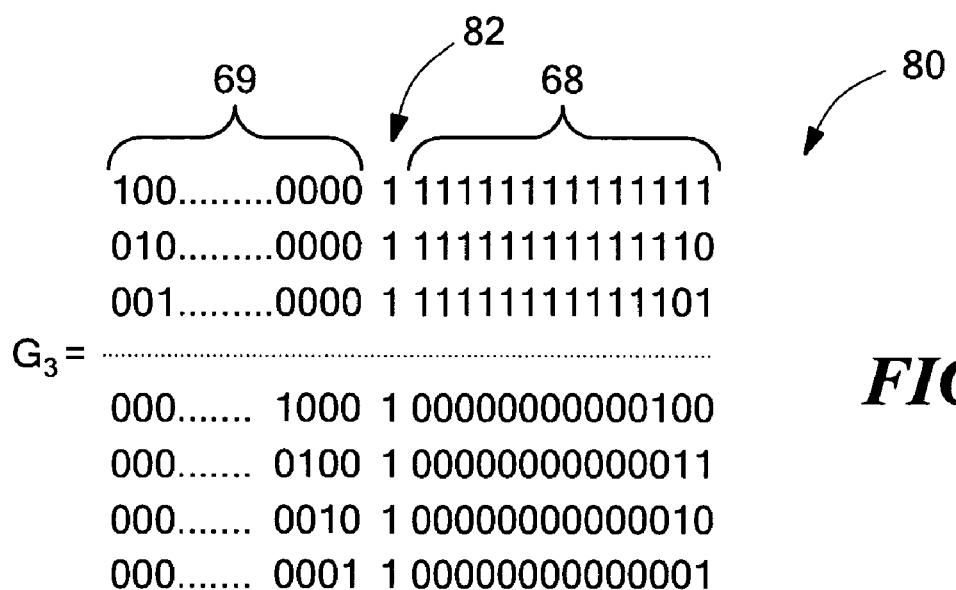
FIG. 5 is a depiction of a generator matrix with a Hamming distance of three for a code with single-bit error correction capability.
Figure 6:
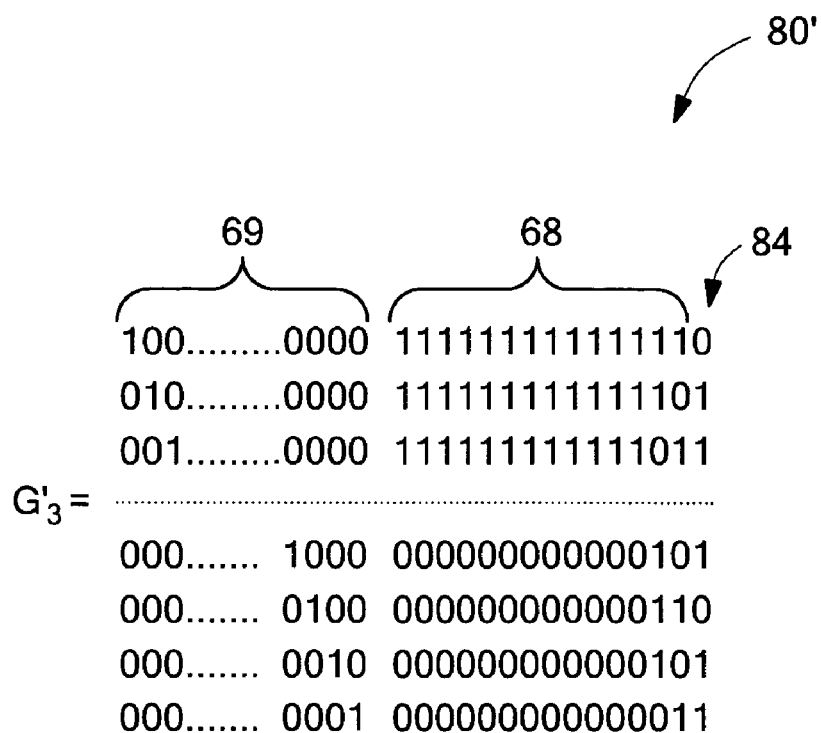
FIG. 6 is a depiction of an alternative generator matrix with a Hamming distance of three for a code with single-bit error correction capability.

The minimum distance of the code described by the generator matrix $G_2$ can be extended to three in a number of ways. Exemplary generator matrices of a minimum distance 3 code are shown in FIGS. 5 and 6. Referring first to FIG. 5, a generator matrix "$G_3$" 80 is produced from $G_2$ (of FIG. 4) by inserting a column of ones 82 into $G_2$ at any redundant bit location. This column provides another check on the data bits (data portion 64). With the inclusion of this new parity check generation column 82, every row of the resulting matrix $G_3$ 80 has a weight of at least three. Referring now to FIG. 6, a second generator matrix "$G'_3$" 80' that can be used to increase the distance to 3 is formed by adding another parity check generation column 84 that provides a parity check on the redundant bits (portion 66) of $G_2$.

Figure 7:
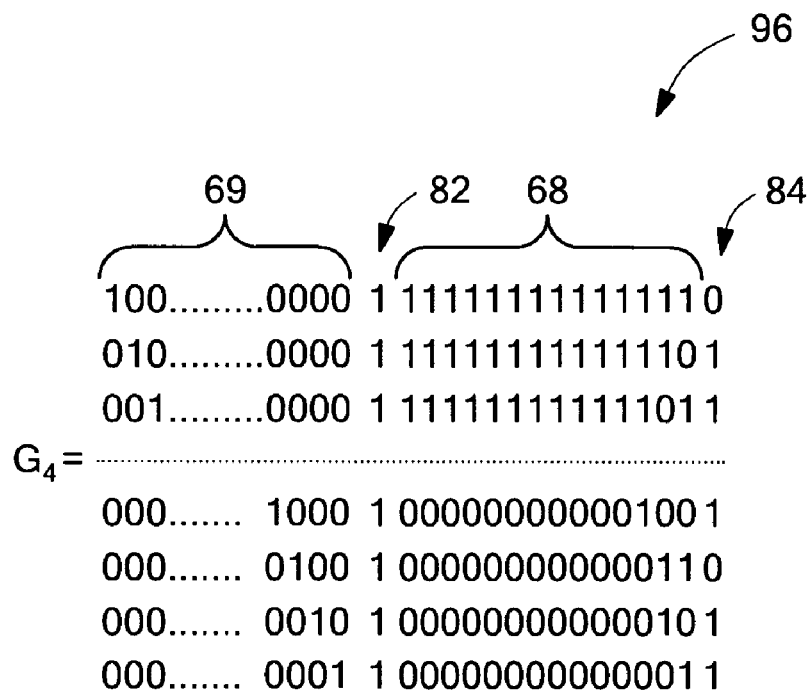
FIG. 7 is a depiction of a generator matrix with a Hamming distance of four for a code with single-bit error correction capability.

Referring to FIG. 7, a generator matrix "$G_4$" 90 having a minimum distance 4 code is shown. This matrix is obtained by combining the parity bits of $G_3$ and $G'_3$. That is, this matrix incorporates both of columns 82 and 84, as shown. In the illustrated matrix, column 0 corresponds to a "parity-on-parity" check generation column 84 and column 15 corresponds to the data parity check generation column 82. The columns 82 and 84 could be inserted at other column locations within the redundancy portion 66, however.

It is a simple matter to prove that $G_4$ is indeed a minimum distance 4 code. First, it can be seen that each row contains at least four '1''s. Therefore, any combination of rows will have even weights. Bits 1 to 14 provide distinct lists of all $2^{14}-1$ binary representations of integers 1 to $2^{14}-1$. Therefore, the sum of any two rows of $G_4$ has at least a single one among bit 1 to bit 14. Together with parity check bit 0, bits 0 through 14 have a weight of at least two for any combination of two rows. Therefore, any combination of two rows has a minimum weight of 4—two from bit 15 to bit $2^{14}-1$ and two from bit 0 to bit 15. For any linear combination of three or more rows of $G_4$ the parity check bit 15 guarantees that the minimum weight is 4.

The codes described by the generator matrices of FIGS. 5-7 can be implemented by a counter and parity check generation circuitry. It will be assumed that columns 70 produce P[0] through P[13], while column 82 is used to produce P[14] and column 84 is used to produce the most significant parity check bit, P[15]. The implementation of the code described by generator matrix $G_4$ can best be illustrated conceptually with a circuit that receives a serial bit stream of data and produces from that data the 16-bit parity check word P[0] through P[15], as shown in FIG. 8.

Figure 8:
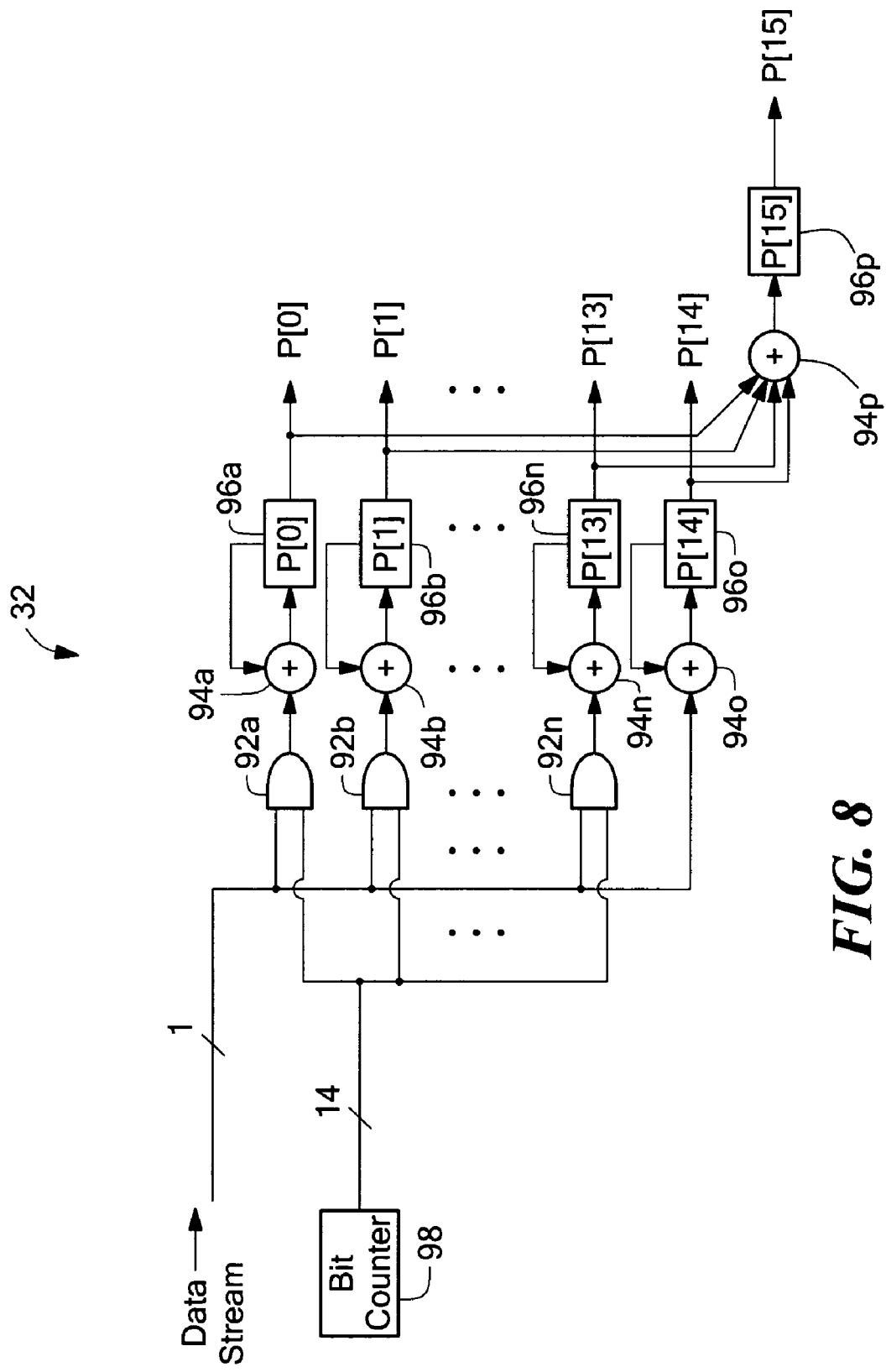
FIG. 8 is a schematic diagram of a single-bit embodiment of the parity check bit generator (of FIG. 2) that implements parity check generation based on the generator matrix of FIG. 7.

Referring to FIG. 8, an embodiment of the parity check bit generator 32 for a serial stream of data includes fourteen AND gates 92a-92n, sixteen XOR gates 94a-94p, fifteen registers 96a-96o and a bit counter 98. Each bit of the serial data stream is provided to each of the AND gates 92 and XOR gate 94o. Each of AND gates 92a-92n is also coupled to a bit in the bit counter 98. The outputs of AND gates 92a-92n are coupled to corresponding ones of the XOR gates, that is, XOR gates 94a-94o, which XOR the AND gate output with the contents of corresponding registers 96a-96n, which store running values of P[0] through P[13], respectively. Each data bit is also provided to XOR 94o, which XORs that bit with the value of P[14] stored in register 96o to produce a new value of P[14]. When the bit counter has counted all $2^{14}$ data bits, the final values of P[0] through P[14] are XOR'ed by the XOR gate 94p to produce P[15], which is stored in register 96p. The final values of the parity check bits P[0] through P[15] are then read from registers 96a-96p, respectively.

It will be appreciated that the circuit elements used to produce P[15], that is, XOR 94p and register 96p, could be eliminated for an implementation of the code described by the generator matrices $G'_3$ (FIG. 6). Similarly, an implementation of the code described by the generator matrix $G_3$ (FIG. 5) would not require circuit elements 94o and 96o used to produce P[14].

In practice, multiple data bits are transferred in parallel over a parallel data path or bus, for example, a 32-bit or 64-bit data bus. Another exemplary implementation of the parity check bit generator 32, this time having a parallel bus of N bits and a buffer width of N-bits, usable to encode the distance 4 code (described by the generator matrix $G_4$ of FIG. 7), is shown in FIGS. 9A and 9B. In the illustrated example, N is 16, but it will be appreciated that different units of data transfer and storage, e.g., 32-bit data buses and 32-bit wide buffers, may be used.

Referring to FIGS. 9A and 9B, the parity check bit generator 32 encodes data according to the generator matrix 90 (FIG. 7) to produce a 16-bit parity check word of parity check bits P[0] through P[15]. It is assumed that the parity-on-parity producing column, shown as column 84 (the first column in the redundant portion of the matrix in FIG. 7), is used to produce the most significant parity check bit, P[15]. FIG. 9A shows a portion of the parity check bit generator circuitry, circuitry 100, used to generate parity check bits P[0] through P[3], 102a-102d. FIG. 9B shows a portion of the parity check bit generator circuitry, circuitry 104, used to generate parity check bits P[4] through P[15], 102e-102p, as well as clock signal 106 and parity bus 108.

Referring to FIG. 9A, the circuitry 100 includes a set of AND gates 110a-d, XOR gates 112a-d and registers 114a-d. The registers 114a, 114b, 114c and 114d are accumulators and thus maintain running values of P[0], P[1], P[2] and P[3], respectively. They are initialized to zero. Each of the AND gates is connected to a corresponding one of the bit patterns/matrix columns 70 (shown here as 70a, 70b, 70c and 79d) and a data bus 116, which provides the 16-bit data words. More specifically, AND gate 110a is connected to P[0] check generation bits of column 1, AND gate 110b is connected to P[1] check generation bits of column 2, and so on. The XOR gates 124 receive as inputs the output of a corresponding one of the AND gates and the current content of a corresponding one of the registers 114. That is, XOR gate 110a receives the output of AND gate 112a and the current value of register 114a, XOR gate 110b receives the output of AND gate 112b and the current value of register 114b, and so on. The registers 114 are clocked by clock signal 106 for each new data word.

Still referring to FIG. 9A, the parity check bits P[0]-P[3] are generated as follows. The parity bit P[0] 102a is generated as the parity sum of all data words received on bus 116 after AND'ing each data word with a 1010101010101010 bit pattern according to the bit selection of the first generator matrix column. Thus, P[0] is the parity of all odd bits. The parity bit P[1] is generated as the parity sum of all data words after AND'ing each data word with a 1100110011001100 bit pattern according to the second generator matrix column so that P[1] is the parity of all the odd-bit pairs. The parity bit P[2] is generated as the parity sum of all data words after AND'ing each data word with a 1111000011110000 bit pattern to select the odd nibbles according to the third column of the generator matrix. The parity bit P[3] 102d is generated as the parity sum of all data words after AND'ing each data word with a 1111111100000000 bit pattern to select the odd bytes according to the fourth column of the generator matrix.

Referring to FIG. 9B, the circuitry 104 includes a counter 120, a set of AND gates 110e-110m, a set of XOR gates 112e-112o and a set of registers 114e-114o. The registers 114e, 114f, 114g, ..., 114m maintain running values of P[4], P[5], P[6], ... P[15], respectively, and are initialized to zero. The registers 114 are clocked by clock signal 106 for each new data word that is received. Each of the AND gates is tied to a different bit of the counter 12, with the AND gate 110e being tied to the counter's least significant bit and the AND gate 110n being tied to the counter's most significant bit. Each of the AND gates receives as a second input a data word parity 122. The XOR gates 112e-112n receive as inputs the output of a corresponding one of the AND gates and the current content of a corresponding one of the registers 114. That is, XOR gate 112e receives the output of AND gate 110e and the current value of register 114e, XOR gate 112f receives the output of AND gate 110f and the current value of register 114f, and so on. The XOR gate 112o is coupled the data word parity and the current value of P[14] stored in the register 114o. The parity bits P[0]-P[3] (from circuitry 100, FIG. 8A) and P[4]-P[14] stored in the corresponding registers 114 are provided to a parity circuit 124 via parity bus 108 to produce parity bit P[15] 102p, which is stored in the last register 114p.

Still referring to FIG. 9B, the parity check bits P[4] through P[15] are generated as follows. The counter 120 counts each of the 16-bit words as they are received in (or read from) the buffer memory. Thus, the counter value represents the address offset of the data word relative to the start of a buffer. In this example, the counter is a 10-bit counter and counts from 1 to 1024. The circuitry 104 computes the parity bits P[4] through P[15] as follows. The parity bits P[4] through P[13] are the sum the parity of whole data words depending on the address offset of the data word relative to the start of the buffer. For example, if the address offset [0] is set, it sums the parity of the whole word into the running P[4] register 114e. If the address offset [1] is set, it sums the parity of the whole data word into the running P[5]. If the address offset [8] is set, it sums the parity of the whole word into the running P[12] register. The parity bit P[14] (from the column of all ones) is the parity of the whole data block. The parity bit P[15] is the parity of the check bits P[0] through P[14].

As was the case with the single bit embodiment of FIG. 8, the parity check bit generator of FIGS. 9A and 9B can be suitably adapted to produce fewer parity check bits for parity check words based on the matrices $G_3$ and $G'_3$. The circuitry involved in the generation of P[14] would not be needed for an implementation of the code described by the generator matrix $G_3$ (FIG. 5). An implementation of the code described by the generator matrix $G'_3$ (FIG. 6) would not require the circuit elements used to produce P[15].

Figure 10:
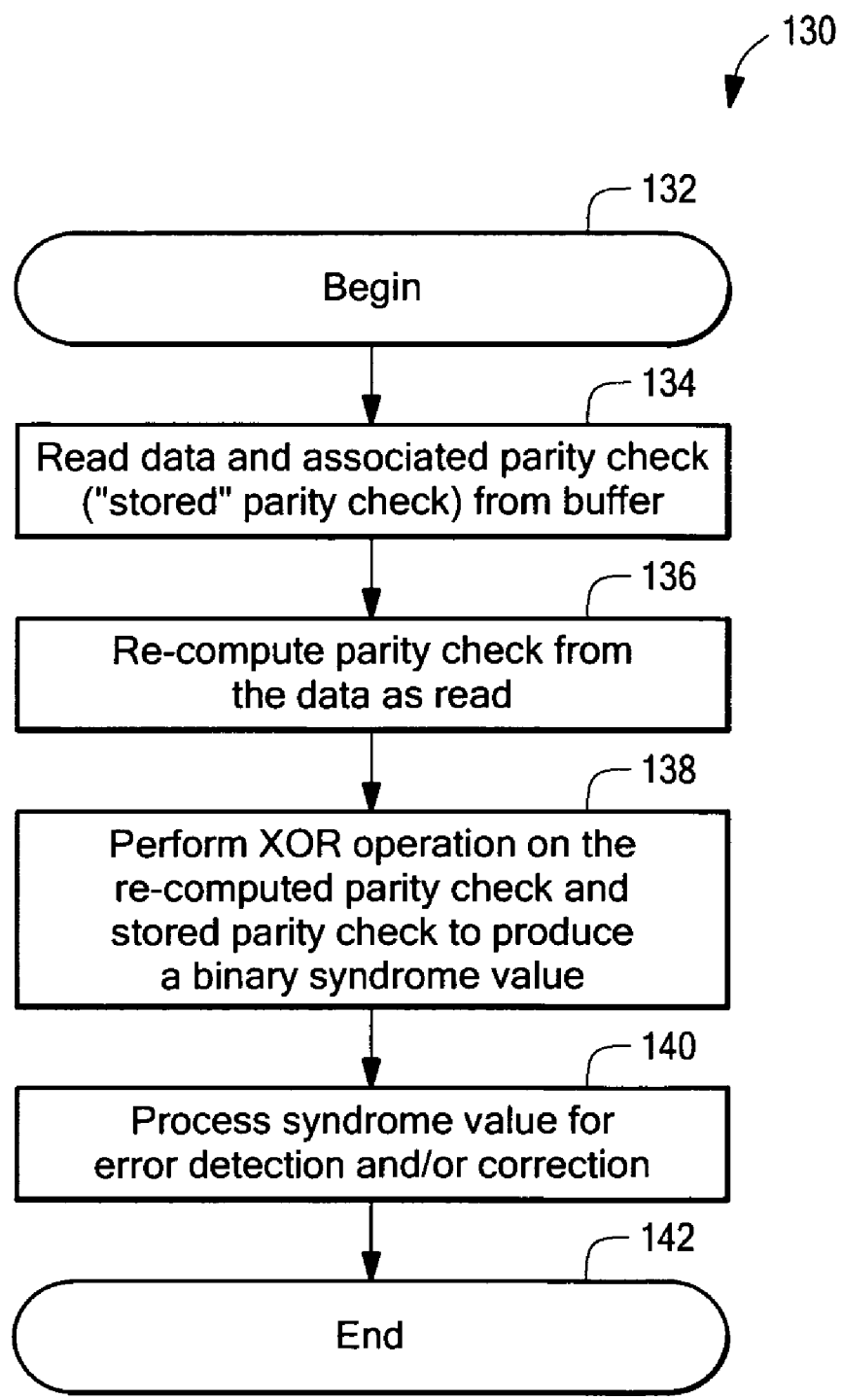
FIG. 10 is a flow diagram of a decoding procedure performed by the ECC unit of FIG. 2.

Referring to FIG. 10, an exemplary decoding procedure 130 used to decode an erroneous code word read from a buffer in the buffer memory 22 is shown. The decoding procedure 130 begins (step 132) by reading the contents of the buffer, that is, the stored data and associated ECC check, from the buffer in buffer memory (step 134). The read data is provided to the parity check bit generator, which re-computes the parity check bits for the data (step 136). The recomputed parity check and the stored parity check are provided to the EDC, which compares the two by XOR'ing them to produce a binary syndrome value (step 138). The decoding procedure 130 processes the syndrome value for error detection and/or correction (step 140) and terminates (step 142).

Figure 11:
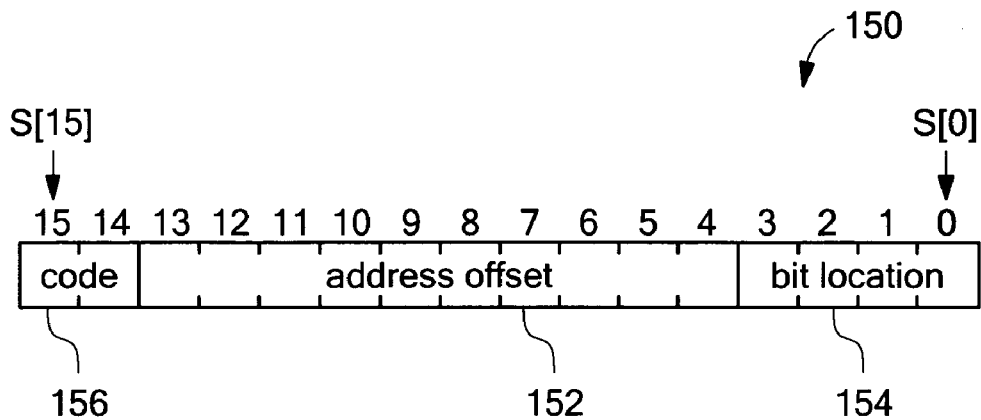
FIG. 11 is an exemplary format of a syndrome produced by the decoding procedure of FIG. 10.

Referring to FIG. 11, an exemplary format of a syndrome 150 generated by the decoding procedure 130 (of FIG. 10) is shown. The syndrome includes 16-bits, bits S[0] through S[15]. Bits S[4] through S[13] define an address offset location 152 and bits S[0] through S[3] define a bit location 154. Remaining bits S[14] and S[15] form a 2-bit syndrome code 156 that signals to the data source whether a signal or double bit error has been detected. The address offset begins at buffer location 1, as illustrated, to easily handle the special case of identifying an error in data word 0.

The syndrome 150 is interpreted according to TABLE 1 below.

TABLE 1

| SYNDROME BIT [15] | SYNDROME BIT [14] | SYNDROME BITS [13:0] | INTERPRETATION |
|---|---|---|---|
| 0 | 0 | 0 | No error |
| 0 | 0 | ≠0 | Two-bit error in data |
| 0 | 1 | 0 | Error in data |
| 0 | 1 | ≠0 | Single-bit error in data; word number (location) and bit number of bit in error indicated by syndrome bits [13:4] & syndrome bits [3:0], respectively |
| 1 | 0 | 0 | Error in check, no error in data |
| 1 | 0 | ≠0 | Error in check and data; two-bit error detected in data |
| 1 | 1 | 0 | Error in check and in data |
| 1 | 1 | ≠0 | Error in check and data; single-bit error detected in data; word number (location) and bit number of bit in error indicated by syndrome bits [13:4] & syndrome bits [3:0], respectively |

The first case in the table represents the normal, "no error" condition. In the fourth and eighth cases (corresponding to a single-bit error), where at least one of bits S[14] and S[15] is a '1' and the bits S[0] through S[13] are not all zeros, the syndrome 150 directly identifies the word location and bit location of a single error in syndrome address offset field 152 and bit location field 154, respectively. The ECC unit 26, having detected a single-bit error and determined the location in memory, performs the correction. Single bit errors in the check are also identified. In response to a parity check error, the processor 12 may send the ECC unit 26 through a correction cycle even though the data was not in error. Double-bit errors are flagged (via the syndrome code 156) but not corrected. These errors may occur in any two bits in the codeword read from memory (two errors in the data, two errors in the check, or one error in each). Errors in three or more bits are beyond the capabilities of the ECC unit 26 to detect.

To increase the distance of the ECC further, more redundant bits are needed in the generator matrix. Thus, in another embodiment that uses a code similar to a BCH code, as described hereinafter with reference to FIGS. 12-14, double-bit error correction capability is achieved.

Figure 12:
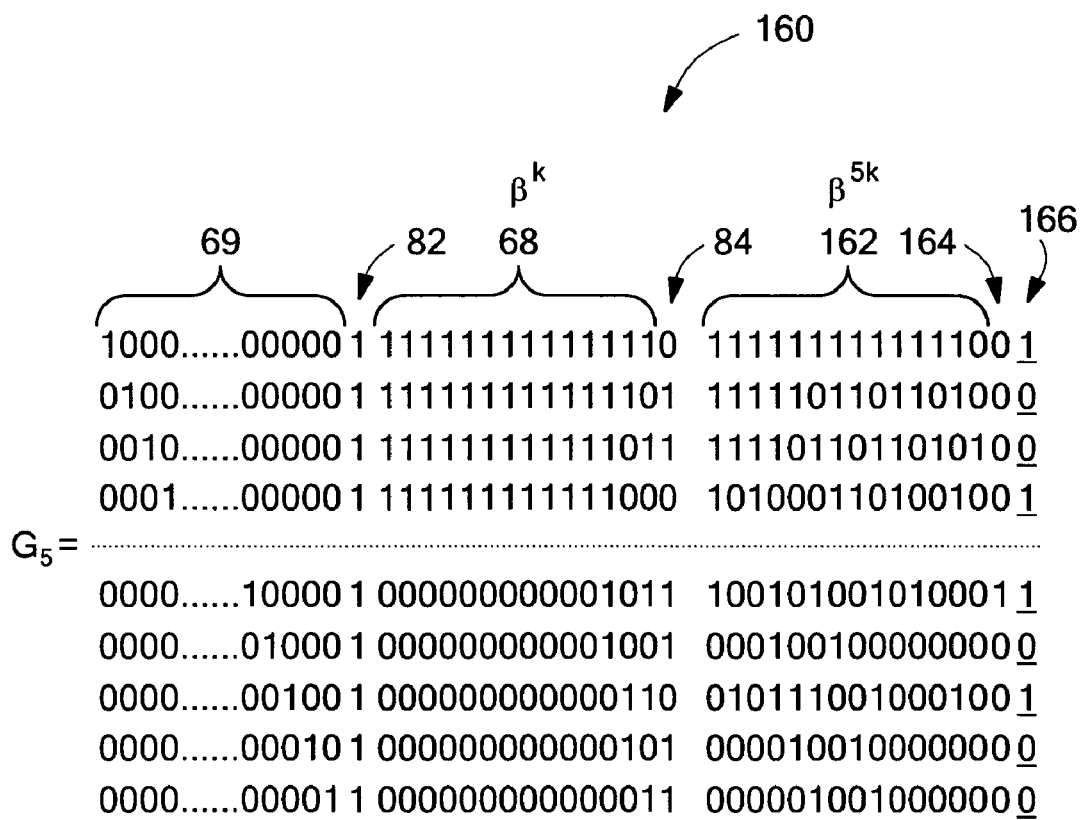
FIG. 12 is a depiction of a generator matrix with a distance of six for a code with double-bit error correction capability.

As shown in FIG. 12, to increase the minimum distance to five, a generator matrix "$G_5$" 160 is formed by adding 14 bits 162 (bits 15 to 28) to the redundant bits in each row of the generator matrix $G_4$ in such a way that these 14 bits have the same properties as the first 14 bits 68 of $G_4$. If the first 14 bits 68 are denoted $\beta^k$, then the additional 14 bits 162 can be $\beta^{sk}$ provided "s" does not divide $2^{14}-1$. Because 3 divides $2^{14}-1$, the next smallest integer that can be used for s is 5. Another value of s that may be used is $2^{14}-2=-1$.

A Galois field of $GF(2^{14})$ may be chosen for the code. The operations are performed in this field but the error locations are ordered as 1, 2, 3, . . . , k, where k is the data length in bits. As usual, an irreducible polynomial of degree 14 $p(x)=x^{14}+x^{13}+x^{12}+x^9+x^8+x+1$ is selected to generate all of the field elements as $x^k \bmod p(x)$ for k=0, 1, 2, . . . , $2^{14}-2$.

A code of distance 5 can be expressed in the conventional Galois field $GF(2^{14})$ generated by p(x). All of the field elements of the conventional field can be expressed as a linear combination of the basis $x^0$, $x^1$, $x^2$, $x^3$, . . . , $x^{13}$. Because the encoding and the decoding of a BCH type of code involves many operations of raising an element in power, multiplications and finding the inverse of the field element, however, a different field representation more suitable for ease of implementation may be used. Instead of using $x^0$, $x^1$, $x^2$, . . . $x^{13}$ as the basis, the elements $x^1$, $x^2$, $x^4$, $x^8$, $x^{16}$, $x^{32}$, $x^{64}$, $x^{128}$, $x^{256}$, $x^{512}$, $x^{1024}$, $x^{2048}$, $x^{4096}$, $x^{8192}$ and $x^{16384}$ are selected as the new basis, which is called a "normal" basis. It is convenient to use a 14-bit binary vector to represent the field elements, and the normal basis are:

$x^1$=<binary>00 0000 0000 0001=<hex>0001
$x^2$=<binary>00 0000 0000 0010=<hex>0002
$x^4$=<binary>00 0000 0000 0100=<hex>0004
$x^8$=<binary>00 0000 0000 1000=<hex>0008
$x^{16}$=<binary>00 0000 0001 0000=<hex>0010
$x^{32}$=<binary>00 0000 0010 0000=<hex>0020
$x^{64}$=<binary>00 0000 0100 0000=<hex>0040
$x^{128}$=<binary>00 0000 1000 0000=<hex>0080
$x^{256}$=<binary>00 0001 0000 0000=<hex>0100
$x^{512}$=<binary>00 0010 0000 0000=<hex>0200
$x^{1024}$=<binary>00 0100 0000 0000=<hex>0400
$x^{2048}$=<binary>01 1000 0000 0000=<hex>0800
$x^{4096}$=<binary>10 0000 0000 0000=<hex>1000
$x^{8192}$=<binary>10 0000 0000 0000=<hex>2000

If the field elements with normal basis representation are denoted $\beta^k$ for k=0, 1, 2, 3, . . . , $2^{14}-2$, then the first few field elements of $\beta^k$ are given by:

$\beta^0$ = <hex> 3fff
$\beta^1$ = <hex> 0001
$\beta^2$ = <hex> 0002
$\beta^3$ = <hex> 0021
$\beta^4$ = <hex> 0004
$\beta^5$ = <hex> 0120
$\beta^6$ = <hex> 0042
$\beta^7$ = <hex> 1121
$\beta^8$ = <hex> 0008
$\beta^9$ = <hex> 1400
$\beta^{10}$ = <hex> 0240
$\beta^{11}$ = <hex> 1d00
$\beta^{12}$ = <hex> 0084
$\beta^{13}$ = <hex> 0093
$\beta^{13}$ = <hex> 0930
$\beta^{14}$ = <hex> 2242
$\beta^{15}$ = <hex> 3d31
$\beta^{16}$ = <hex> 0010
$\beta^{17}$ = <hex> 2080
$\beta^{18}$ = <hex> 2800
$\beta^{19}$ = <hex> 2290
$\beta^{20}$ = <hex> 0480
$\beta^{21}$ = <hex> 1d00
.
.
.

It can be seen that $\beta^{2*k}$ can be obtained from $\beta^k$ by cyclic rotation to the left by one bit. Therefore, all $\beta^{k*q}$ can be obtained from $\beta^k$ by cyclic rotation of $\beta^k$ to the left by s bit if $q=2^s$.

Still referring to FIG. 12, to achieve a code having a minimum distance 6, a column of parity check generation bits 164 is added to the matrix so that there is a parity check generation bit added to the 14 additional bits 162 in each row. In this manner a distance 6 code can be designed with 31-bit redundancy. To make the number of bits a practical number of 32-bits of 4 bytes, an additional column of parity check generation bits 166 (the column of right-most, underlined bits) is provided. Each bit in this column is obtained as the parity check on the three parity bits in columns 82, 84 and 164 of the same row. Although the additional bit does not increase the minimum distance, it reduces the mis-correction probability by approximately a factor of two.

FIG. 13 shows a C code implementation of encoding processing 170 for the 32-bit code described by the generator matrix 160 (of FIG. 12). Initially, a first variable "syndrome_x_0" corresponds to the '1' bit in column 82, a second variable "syndrome_x_1" corresponds to $\beta^k$ (bits 68) and a third variable "syndrome_x_5" corresponds to $\beta^{5k}$ (bits 182). A processing step 172 sets the first variable to a '1', a processing step 173 (routine 'add_parity(position)') appends a single redundant bit (column 84 bit) to $\beta^k$ to make the total number of 1 bits an even number. A processing step 174 (routine 'add_parity(fifth_power(element))') appends a single redundant bit (column 164 bit) to the element $\beta^{5k}$. The element $\beta^{5k}$ is generated by multiplying the element $\beta^k$ by itself a total of five times, the equivalent of multiplying the element with a 2-bit cyclic shift version of the element. A processing step 176 generates the parity-on-parity bit (column 166) from the redundant bits in columns 82, 84 and 164. These processing steps are repeated for each of the $2^{14}-1$ matrix rows.

The single-error-correcting algorithm for the code described by generator matrix 160 is the same as the decoding procedure described above with reference to FIG. 10, except that a mapping of the error location from a Galois field element to the natural number is eliminated. Instead, the error location is provided by the binary representation $\beta^k$.

A double-error-correction decoding algorithm for the code described by generator matrix 160 will now be described. The decoding algorithm requires four or more consecutive syndromes $S_j$, $S_{j+1}$, $S_{j+2}$ and $S_{j+3}$ to generate the error locator polynomial $\sigma(x)$. The syndrome $S_0$ for a double-error is equal to 0, and the syndromes $S_1$, $S_2=(S_1)^2$, $S_4=(S_1)^4$ and $S_5$ are readily available from the parity check bits. Syndrome $S_3$ is not available, however. The consecutive syndromes are denoted as $S_0$, $S_1$, $S_2$, Z, $S_4$, $S_5$ and $Z^2$, where $S_6=(S_3)^2=Z^2$. The parity bit on $S_1$ is denoted as $P_1$, the parity bit on $S_5$ is denoted as $P_5$, and the parity on $S_0$, $P_1$ and $P_5$ is denoted as Pa.

First, for a single error correction, an error locator polynomial $\sigma(x)=\sigma_1 x+1$, where $\sigma_1=S_1$, is assumed. If $S^5=(S_1)^5$, the correction is correct. If the single correction fails, then a two-error correction should be attempted assuming the error locator polynomial to be $\sigma(x)=\sigma_2 x^2+\sigma_1 x+\beta^0$.

Using the first three consecutive syndromes gives $\sigma_2 S_0+\sigma_1 S_1+\beta^0 S_2=0$. If one substitutes $S_0=0$ and $S_2=S_1^2$, then $\sigma_1=S_1$. Using the next three consecutive syndromes starting with $S_1$ gives $\sigma_2 S_1+\sigma_1 S_2+\beta^0 Z=0$. Substituting $\theta_1=S_1$ in the equation gives $\sigma_2 S_1+\theta_1(S_1)^2+Z=0$. Using the next three consecutive syndromes starting at $S_4$ gives $\sigma_2 S_4+\sigma_1 S_5+\beta^0 Z^2=0$. By substituting $\sigma_1=S_1$ and $S_4=(S_1)^4$, the equation becomes $\sigma_2(S_1)^4+S_1*S_5+Z^2=0$. Therefore, the equations to solve are as follows:

$$\sigma_2 S_1+(S_1)^2+Z=0 \qquad \text{Eq. 1}$$

$$\sigma_2(S_1)^4+S_1*S_5+Z^2=0 \qquad \text{Eq. 2}$$

The first equation (Eq. 1) is squared and then added to the second equation (Eq. 2) to form $(\sigma_2)^2(S_1)^2+\sigma_2(S_1)^4+(S_1)^4+S_1*S_5=0$. The resulting equation is a quadratic equation for the unknown $\sigma_2$, which can be solved with known techniques. Note that there are two solutions to $\sigma_2$, but only one of them with yield the correct results.

An alternative approach is to solve Z first, by multiplying Eq. 1 by $(S_1)^3$ and then adding it to Eq. 2, to give $(S_1)^5+S_1*S^5+(S_1)^3*Z+Z^2=0$. The resulting equation is a quadratic equation in Z, which can be solved for $Z=S_3$. As in the case of $\sigma_2$, there are two solutions for Z, but only one correct solution. Once $S_3$ is known, a conventional BCH decoding algorithm can be used to find the error locator polynomial $\sigma(x)$.

When the number of errors in the data is known from the solved $\sigma(x)$, the total number of errors in the data part and in the parity check part should add up to a number no greater than 2.

Conditions that indicate the number of errors in the check bits (excluding the error in Pa) are provided in TABLE 2 below.

TABLE 2

| Case | $S_0$ | $P_1$ | $P_5$ | $P_a$ | Number of errors in check bits |
|---|---|---|---|---|---|
| 0 | 0 | 0 | 0 | 0 | 0 |
| 1 | 0 | 0 | 0 | 1 | 0 |
| 2 | 0 | 0 | 1 | 0 | 1 |
| 3 | 0 | 0 | 1 | 1 | 1 |
| 4 | 0 | 1 | 0 | 0 | 1 |
| 5 | 0 | 1 | 0 | 1 | 1 |
| 6 | 0 | 1 | 1 | 0 | 2 |
| 7 | 0 | 1 | 1 | 1 | 2 |
| 8 | 1 | 0 | 0 | 0 | 1 |
| 9 | 1 | 0 | 0 | 1 | 1 |
| 10 | 1 | 0 | 1 | 0 | 2 |
| 11 | 1 | 0 | 1 | 1 | 2 |
| 12 | 1 | 1 | 0 | 0 | 2 |
| 13 | 1 | 1 | 0 | 1 | 2 |
| 14 | 1 | 1 | 1 | 0 | 3 |
| 15 | 1 | 1 | 1 | 1 | 3 |

Figure 14:
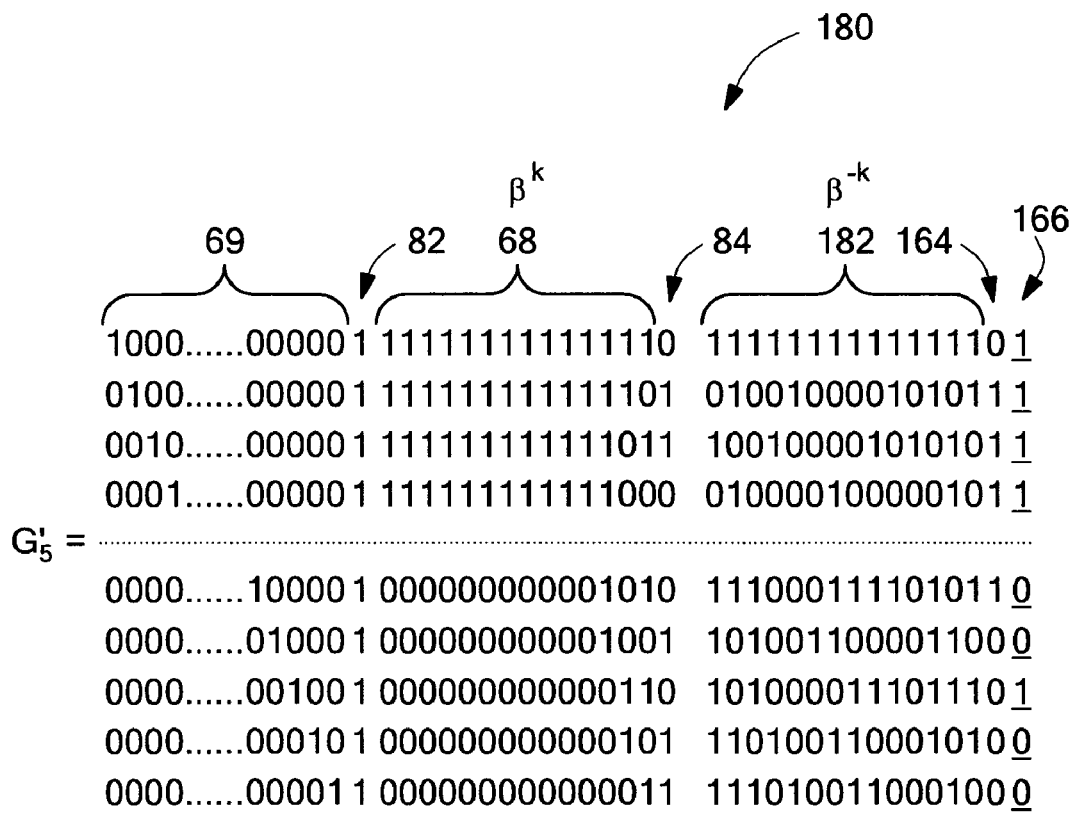
FIG. 14 is a depiction of an alternative generator matrix with a distance of six for a code with double-bit error correction capability.

In an alternative implementation, and referring to FIG. 14, a matrix G'$_6$ 180 is formed if the elements $\beta^{5k}$ of the generator matrix G$_6$ are replaced by an element $\beta^{-k}$ 182. In this case, the consecutive syndromes $S_{-2}$, $S_{-1}$, $S_0$, $S_1$ and $S_2$ can be computed. Noting that $S_{-2}=(S_{-1})^2$ and $S_2=(S_1)^2$, the equations for the degree 2 $\sigma(x)$ can be formed as $\sigma_2*S_{-2}+\sigma_1*S_{-1}+\beta_0*S_0=0$ with $S_0=0$ and $S_{-2}=(S_{-1})^2$, which gives $\sigma_1=\sigma_2*S_{-1}$. Using the next three consecutive syndromes gives $\sigma_2*S_{-1}+\sigma_1*S_0+\beta_0*S_1=0$, with $S_0=0$. Therefore, the coefficients for $\sigma(x)$ become $\sigma_2=S_1/S_{-1}$ and $\sigma_1=S_1$.

The inverse of a Galois field element is needed in the above decoding algorithm. The operations for the inverse computation can be performed in the following manner. Given a 14-bit Galois field element A=($a_2$, $a_1$), where $a_2$ is the upper 7 bits of A and $a_1$ is the lower 7 bits of A, a second 14-bit Galois field element B is formed by swapping the upper 7 bits with the lower 7 bits in A so that B=($a_1$, $a_2$). It is possible to form C=A*B and use a table-lookup to find the inverse of C, namely, $C^{-1}$. Once $C^{-1}$ has be determined, the inverse of A, $A^{-1}$, can be determined from $A^{-1}=C^{-1}*B$. The table used in the table-lookup requires only 128 entries.

To illustrate the encoding/decoding method of the double error correcting code, an example using a Galois field of GF($2^3$) is provided as follows. The example assumes the Galois field is generated by the irreducible polynomial $p(x)=x^3+x^2+1$, with the field elements {0=(000), $\alpha^0$=(001), $\alpha^1$=(010), $\alpha^2$=(100), $\alpha^3$=(101), $\alpha^4$=(111), $\alpha^5$=(011), $\alpha^6$=(110)}. This field is represented by the conventional representation. That is, the basis includes three elements: $\alpha^0$=

(001); $\alpha^1$=(010); and $\alpha^2$=(100). To use normal basis representation, the basis includes the elements $\alpha^1$=(010), $\alpha^2$=(100) and $\alpha^4$=(111).

All of the elements in normal basis representations can be obtained as follows. The method uses $\beta^j$=[xyz] to represent the normal basis representation, where [xyz] is a binary number. The element $\beta^j$=[xyz] is defined as follows:

$$\beta^j = [xyz] = x*\alpha^4 + y*\alpha^2 + z*\alpha^1 = x*\beta^4 + y*\beta^2 + z*\beta^1.$$

With this definition and by setting y=z=0 and x=1, it is possible to obtain $\beta^4$=[100]=$\alpha^4$; and, similarly, $\beta^2$=[010]= $\alpha^2$, and $\beta^1$=[001]=$\alpha^1$. The normal basis representation of all of the elements can be readily obtained, and are given by the following:

[000]=0; [001]=$\beta^1$=$\alpha^1$; [010]=$\beta^2$=$\alpha^2$; [011]=$\beta^2$+$\beta^1$=$\alpha^2$+$\alpha^1$= (100)+(010)=(110)=$\alpha^6$=$\beta^6$; [100]=$\beta^4$=$\alpha^4$; [101]=$\beta^4$+$\beta^1$=$\alpha^4$+$\alpha^1$=(111)+(010)=(101)=$\alpha^3$=$\beta^3$; [110]=$\beta^4$+$\beta^2$=$\alpha^4$+$\alpha^2$=(111)+(100)=(011)=$\alpha^5$=$\beta^5$; and [111]= $\beta^4$+$\beta^2$+$\beta^1$=$\alpha^4$+$\alpha^2$+$\alpha^1$=(111)+(100)+(010)=(001)=$\alpha^0$=$\beta^0$.

The relation and elements are summarized below:

$\alpha^0$=(001)=$\beta^0$=[111]

$\alpha^1$=(010)=$\beta^1$=[001]

$\alpha^2$=(100)=$\beta^2$=[010]

$\alpha^3$=(101)=$\beta^3$=[101]

$\alpha^4$=(111)=$\beta^4$=[100]

$\alpha^5$=(011)=$\beta^5$=[110]

$\alpha^6$=(110)=$\beta^6$=[011]

From this point onward, only the normal basis representation $\beta^j$ is used.

The matrix $G_4$ (from FIG. 7) for the GF($2^3$) example is given by:

$$G_4 = \begin{bmatrix} 1&0&0&0&0&0&0&1&1&1&1&1 \\ 0&1&0&0&0&0&0&1&1&1&1&0&0 \\ 0&0&1&0&0&0&0&1&1&0&1&0 \\ 0&0&0&1&0&0&0&1&1&0&0&1 \\ 0&0&0&0&1&0&0&1&0&1&1&0 \\ 0&0&0&0&0&1&0&1&0&1&0&1 \\ 0&0&0&0&0&0&1&1&0&0&1&1 \end{bmatrix} = \begin{bmatrix} 1&0&0&0&0&0&0&1&\beta^0&1 \\ 0&1&0&0&0&0&0&1&\beta^5&0 \\ 0&0&1&0&0&0&0&1&\beta^3&0 \\ 0&0&0&1&0&0&0&1&\beta^4&1 \\ 0&0&0&0&1&0&0&1&\beta^6&0 \\ 0&0&0&0&0&1&0&1&\beta^2&1 \\ 0&0&0&0&0&0&1&1&\beta^1&1 \end{bmatrix}$$

The matrix $G_6$ (from FIG. 12) for the present example is given by (with columns 1 and 3 represented by $\beta^k$ and $\beta^{5k}$, respectively):

$$G_6 = \begin{bmatrix} 1&0&0&0&0&0&0&1&1&1&1&1&1&1&1 \\ 0&1&0&0&0&0&0&1&1&1&0&0&1&0&0&1 \\ 0&0&1&0&0&0&0&1&1&0&1&0&0&0&1&1 \\ 0&0&0&1&0&0&0&1&1&0&0&1&0&1&1&0 \\ 0&0&0&0&1&0&0&1&0&1&1&0&0&1&0&1 \\ 0&0&0&0&0&1&0&1&0&1&0&1&1&0&1&0 \\ 0&0&0&0&0&0&1&1&0&0&1&1&1&1&0&0 \end{bmatrix} =$$

$$\begin{bmatrix} 1&0&0&0&0&0&0&1&\beta^0&1&\beta^0&1 \\ 0&1&0&0&0&0&0&1&\beta^5&0&\beta^4&1 \\ 0&0&1&0&0&0&0&1&\beta^3&0&\beta^1&1 \\ 0&0&0&1&0&0&0&1&\beta^4&1&\beta^6&0 \\ 0&0&0&0&1&0&0&1&\beta^6&0&\beta^2&1 \\ 0&0&0&0&0&1&0&1&\beta^2&1&\beta^3&0 \\ 0&0&0&0&0&0&1&0&1&\beta^1&1&\beta^5&0 \end{bmatrix}$$

Letting the information bits be [0 0 1 0 0 1 1], the code word is given by [0 0 1 0 0 1 1]*$G_6$=[0 0 1 0 0 1 1 1 1 1 0 0 0 1 0 1]=c. Assuming an error is [0 0 0 1 0 1 0 0 0 0 0 0 0 0 0 0]=e, the read back corrupted code word is [0 0 1 1 0 0 1 1 1 1 0 0 0 1 0 1]. The data bit of the read back corrupted code word is used to compute the following check bits:

[0 0 1 1 0 0 1]*$G_6$=[1 000 0 100 1]. Exclusive-ORing the above with the check bits of the read back corrupted codeword gives:

[1 1 1 0 0 0 1 0 1]+[1 000 0 100 1]=[0 110 0 110 0]=[1 $\beta^5$ 0 $\beta^5$ 0]. Therefore, $S_1$=$\beta^5$ and $S_5$=$\beta^5$.

Assuming the two errors are $\beta^i$ and $\beta^j$, it is possible to form the following two equations:

$$\beta^i + \beta^j = S_1 = \beta^5; \quad\quad \text{and Eq. 3}$$

$$\beta^{5i} + \beta^{5j} = S_5 = \beta^5. \quad\quad \text{Eq. 4}$$

Raising Eq. 3 to the fifth power gives the following equation:

$$\beta^{5i} + \beta^{4i}*\beta^j + + \beta^{i}*\beta^{4j} + \beta^{5j} = \beta^{25} = \beta^4. \quad\quad \text{Eq. 5}$$

Adding Eq. 4 to Eq. 5 gives $$\beta^{4i}*\beta^j + + \beta^{i}*\beta^{4j} = \beta^{i}*\beta^{j}*(\beta^{3i}+\beta^{3j}) = \beta^5 + \beta^4 = \beta^2, \text{ or}$$

$$\beta^{i}*\beta^{j}*(\beta^{3i}+\beta^{3j}) = \beta^2. \quad\quad \text{Eq. 6}$$

In Eq. 6, both $\beta^i*\beta^j$ and ($\beta^{3i}+\beta^{3j}$) are unknown, and the goal is to find $\beta^i*\beta^j$. Raising $S_1$ to cubic power gives:

$$\beta^{3i} + \beta^{2i}*\beta^j + \beta^{i}*\beta^{2j} + \beta^{3j} = S_1^3 = \beta^1, \text{ or}$$

$$(\beta^{3i}+\beta^{3j}) + \beta^{i}*\beta^{j}*(\beta^i+\beta^j) = \beta^1, \text{ or}$$

$$(\beta^{3i}+\beta^{3j}) + \beta^{i}*\beta^{j}*S_1 = \beta^1, \text{ or}$$

$$(\beta^{3i}+\beta^{3j}) + \beta^{i}*\beta^{j}*\beta^5 = \beta^1. \quad\quad \text{Eq. 7}$$

Substituting Eq. 7 into Eq. 6 provides the following:

$$\beta^{i}*\beta^{j}*(\beta^{i}*\beta^{j}*\beta^5 + \beta^1) = \beta^2, \text{ or}$$

$$(\beta^{i}*\beta^{j})^2*\beta^5 + (\beta^{i}*\beta^{j})*\beta^1 = \beta^2. \quad\quad \text{Eq. 8}$$

If every term is divided by $\beta^5$, then $(\beta^{i}*\beta^{j})^2 + (\beta^{i}*\beta^{j})*\beta^3 + \beta^4 = 0$.

By letting $(\beta^{i}*\beta^{j}) = \beta^3*W$, $\beta^6*W^2 + \beta^6*W + \beta^4 = 0$, which leads to the following:

$$W^2 + W + \beta^5 = 0 \quad\quad \text{Eq. 9}$$

To solve a quadratic equation in GF($2^m$), it is necessary to pre-store the solutions $\beta^1 + (\beta^1)^2 = \beta^6 = [011]$ and $\beta^6 + (\beta^6)^2 = \beta^3 = [101]$. The requirement in this example is that the constant term has to be of even weight. In Eq. 9, the constant term is $\beta^5=[110]$, which can be decomposed into $[110]=[011]+[101]$. Consequently, one solution of Eq. 9 is $W=\beta^1+\beta^6=\beta^2$. The other solution for W is $\beta^2+\beta^0=\beta^3$. Therefore, the two solutions for $(\beta^i*\beta^j)=\beta^3*W$ are $\beta^5$ and $\beta^6$.

The method first tries $(\beta^i*\beta^j)=\beta^5$ and $(\beta^i+\beta^j)=S_1=\beta^5$ in finding the solutions to $x^2+\beta^5*x+\beta^5=0$. Using the same procedure as before, and letting $x=\beta^5*y$, gives $(\beta^5*y)^2+(\beta^5)^2*y+\beta^5=0$. Dividing every term by $(\beta^5)^2$ gives $y^2+y+\beta^2=0$. Since $\beta^2=[010]$ has an odd weight, $y^2+y+\beta^2=0$ has no solutions.

Next the method solves the quadratic equation for $(\beta^i*\beta^j)=\beta^6$, which gives the following equation:

$$x^2+\beta^5*x+\beta^6=0. \qquad \text{Eq. 10}$$

Using $x=\beta^5*y$ results in $(\beta^5*y)^2+(\beta^5)^2*y+\beta^6=0$. Dividing every term by $(\beta^5)^2$ then gives:

$$y^2+y+\beta^3=0. \qquad \text{Eq. 11}$$

From the foregoing it can be seen that one solution for Eq. 11 is $y=\beta^6$ and the other solution for Eq. 11 is $y=\beta^6+\beta^0=\beta^4$. Thus, the solutions for $x^2+\beta^5*x+\beta^6=0$ (Eq. 10) are $x=\beta^4$ and $x=\beta^2$. This result can be verified by determining that $\beta^4+\beta^2=\beta^5=S_1$.

The first error location is given by $\beta^4=[100]$. The actual error occurs at location $100-1=011$ or bit 3, assuming the right-most data bit is bit 0. The second error location is given by $\beta^2=[010]$. Again, if the right-most data bit is bit 0, the actual error occurs at location $010-1=001$ or bit 1.

For the case of G'6, the error locations are obtained from $\beta^k$ and $\beta^{-k}$. Using $\beta^k$ and $\beta^{-k}$ may simplify the computation. The generator matrix $G'_6$ for the running example is in the form of the following:

$$G'_6 = \begin{matrix} 1 & 0 & 0 & 0 & 0 & 0 & 0 & 1 & 1 & 1 & 1 & 1 & 1 & 1 & 1 \\ 0 & 1 & 0 & 0 & 0 & 0 & 0 & 1 & 1 & 1 & 0 & 0 & 0 & 1 & 0 & 1 \\ 0 & 0 & 1 & 0 & 0 & 0 & 0 & 1 & 1 & 0 & 1 & 0 & 1 & 0 & 0 & 1 \\ 0 & 0 & 0 & 1 & 0 & 0 & 0 & 1 & 1 & 0 & 0 & 1 & 1 & 0 & 1 & 0 \\ 0 & 0 & 0 & 0 & 1 & 0 & 0 & 1 & 0 & 1 & 1 & 0 & 0 & 0 & 1 & 1 \\ 0 & 0 & 0 & 0 & 0 & 1 & 0 & 1 & 0 & 1 & 0 & 1 & 1 & 1 & 0 & 0 \\ 0 & 0 & 0 & 0 & 0 & 0 & 1 & 1 & 0 & 0 & 1 & 1 & 0 & 1 & 1 & 0 \end{matrix} =$$

$$\begin{matrix} 1 & 0 & 0 & 0 & 0 & 0 & 0 & 1 & \beta^0 & 1 & \beta^0 & 1 \\ 0 & 1 & 0 & 0 & 0 & 0 & 0 & 1 & \beta^5 & 0 & \beta^2 & 1 \\ 0 & 0 & 1 & 0 & 0 & 0 & 0 & 1 & \beta^3 & 0 & \beta^4 & 1 \\ 0 & 0 & 0 & 1 & 0 & 0 & 0 & 1 & \beta^4 & 1 & \beta^3 & 0 \\ 0 & 0 & 0 & 0 & 1 & 0 & 0 & 1 & \beta^6 & 0 & \beta^1 & 1 \\ 0 & 0 & 0 & 0 & 0 & 1 & 0 & 1 & \beta^2 & 1 & \beta^5 & 0 \\ 0 & 0 & 0 & 0 & 0 & 0 & 1 & 1 & \beta^1 & 1 & \beta^6 & 0 \end{matrix}$$

Assuming the information bits to be [0 0 1 0 0 1 1], the code word is given by [0 0 1 0 0 1 1]*$G_6'$=[0 0 1 0 0 1 1 1 1 1 0 0 0 0 1 1]=c'. Assuming the error is [0 0 1 0 1 0 0 0 0 0 0 0 0 0 0 0]=e'=e, the read back corrupted code word is [0 0 1 1 0 0 1 1 1 1 0 0 0 0 1 1]. Using the data bit of the read back corrupted code word to compute the check bits thus gives

[0 0 1 1 0 0 1]*$G_6'$=[1 000 0 010 1]. Exclusive-ORing the above with the check bit of the read back corrupted codeword gives

[1 1 1 0 0 0 0 1 1]+[1 000 0 010 1]=[0 110 0 011 0]=[1 $\beta^5$ 0 $\beta^6$ 0]. Therefore, $S_1=\beta^5$ and $S_{-1}=\beta^6$.

Assuming the two errors are $\beta^i$ and $\beta^j$, it is possible to form the following two equations:

$$\beta^i+\beta^j=S_1=\beta^5; \text{ and} \qquad \text{Eq. 12}$$

$$\beta^{-i}+\beta^{-j}=S_{-1}=\beta^6. \qquad \text{Eq. 13}$$

Since it is known that $S_0=0$ because there are two errors, then $(\beta^i*\beta^j)*S_{-1}+(\beta^i+\beta^j)*S_0+\beta^0*S_1=0$, or $(\beta^i*\beta^j)*\beta^6+\beta^5=0$, and thus $(\beta^i*\beta^j)=\beta^5/\beta^6=\beta^6$. The equation to solve is the following:

$$x^2+(\beta^i+\beta^j)*x+(\beta^i*\beta^j)=0, \text{ or } x^2+\beta^5*x+\beta^6=0. \qquad \text{Eq. 14}$$

Since Eq. 14 is the same as Eq. 10, it is understood to be the correct equation.

It is to be understood that while the invention has been described in conjunction with the detailed description thereof, the foregoing description is intended to illustrate and not limit the scope of the invention, which is defined by the scope of the appended claims. Other embodiments are within the scope of the following claims. All publications and references cited herein are expressly incorporated herein by reference in their entirety.

What is claimed is:

1. A method of decoding errors occurring in data stored in memory, comprising:
   applying data to be stored in a buffer memory as a plurality of data words to a generator matrix to generate a set of parity check bits;
   storing the plurality of data words in a plurality of data buffer locations in the buffer memory and the set of parity check bits in one or more parity check buffer locations in the buffer memory, the parity check buffer locations being different locations than the data buffer locations that contain the data;
   reading all of the stored data words and the set of parity check bits from the respective data buffer and parity check buffer locations;
   regenerating the set of parity check bits for all of the data words; and
   producing from all of the stored and the set of regenerated parity check bits a result that is usable to directly identify:
   i. the data buffer location that contains a data word with an erroneous bit and
   ii. the position of the erroneous bit in the data word contained in the identified data buffer location.

2. The method of claim 1 wherein the result is in the form of a syndrome.

3. The method of claim 1 wherein the result identifies an address of the data buffer location.

4. The method of claim 1 wherein the generator matrix comprises a data portion and a parity check generation portion, and the parity check generation portion comprises rows of bits corresponding to binary representations of the data buffer locations used to store the data words.

5. The method of claim 4 wherein the parity check generation portion of the generator matrix comprises columns of bit sequences usable to select combinations of data bits for parity check bit generation, each column corresponding to a different parity check bit.

6. The method of claim 5 wherein the generator matrix has a minimum distance of three and describes an error correction code with single-bit error correction capability.

7. The method of claim 6 wherein one of the columns is usable to generate a parity check bit for the parity check bits that correspond to the data.

8. The method of claim 6 wherein one of the columns is usable to select data parity in producing a parity check bit.

9. The method of claim 5 wherein the generator matrix has a minimum distance of four and describes an error correction code with single-bit error correction capability.

10. The method of claim 9 wherein the columns comprise a column to select data parity in producing a parity check bit and a column to generate a parity check bit for the parity check bits that correspond to the data.

11. The method of claim 5 wherein the generator matrix has a minimum distance of five and describes an error correction code with a double-bit error correction capability, and wherein producing comprises:
producing from the stored and regenerated parity check bits a result that is usable to directly identify the positions of two erroneous bits of the data word contained in the identified data buffer location.

12. The method of claim 11 wherein the rows of the parity check generation portion comprise bits corresponding to a first field element and a second field element, and wherein the second field element has the same properties as the first field element.

13. The method of claim 12 wherein the second field element is generated from the first field element.

14. The method of claim 12 wherein the second field element is generated from the first field element by a cyclic rotation of bits in the first field element.

15. The method of claim 12 wherein the first and second field elements are field elements of a Galois field of $GF(2^p)$, where p is an integer.

16. The method of claim 15 wherein the first element comprises a binary representation $\beta^k$ and the second element comprises a binary representation $\beta^{sk}$ where k is an integer in a range of 1 to $2^p-1$ and s does not divide $2^p-1$.

17. The method of claim 16 wherein the integer p is equal to 14.

18. The method of claim 17 wherein s is equal to 5.

19. The method of claim 16 wherein the two erroneous bits are associated with ones of the first and second elements, and the first and second elements provide the positions of the two erroneous bits.

20. The method of claim 19 wherein the first element comprises a binary representation $\beta^k$ and the second element comprises a binary representation $\beta^{-k}$ where k is an integer in a range of 1 to $2^p-1$.

21. The method of claim 13 wherein the first element comprises a normal basis representation of a binary number.

22. An encoding method comprising:
applying data to be stored in a buffer memory to a generator matrix as a plurality of data words to generate a set of parity check bits for all the data words;
wherein the generator matrix comprises a data portion and a parity check generation portion, and the parity check generation portion comprises rows of bits corresponding to binary representations of respective data buffer locations to be used to store all of the data words;
storing all of the data words in the buffer memory at the data buffer locations; and
storing the set of parity check bits in one or more parity check locations of the buffer memory, the parity check locations being different locations than the data buffer locations that contain the data.

23. A data storage system comprising:
a storage medium;
a controller coupled to the storage medium; and
a buffer memory coupled to the storage medium and the controller for storing data to be written to the storage medium and data read from the storage medium;
wherein the controller is operable to perform the following steps:
applying data to be stored in a buffer memory as a plurality of data words to a generator matrix to generate a set of parity check bits;
storing all of the data words in a plurality of data buffer locations and the set of parity check bits in one or more parity check buffer locations of the buffer memory, the parity check buffer locations being different than the data buffer locations that contain the data;
reading all of the stored data words and the set of parity check bits;
regenerating the set parity check bits for all of the data words; and
producing from all of the stored data words and all of the regenerated parity check bits a result that is usable to directly identify:
i. a data buffer location that contains a data word with an erroneous bit, and
ii. the position of the erroneous bit in the data word.

24. A data storage system comprising:
a storage medium;
a controller coupled to the storage medium; and
a buffer memory coupled to the storage medium and the controller for storing data to be written to the storage medium and data read from the storage medium;
wherein the controller is operable to perform the following steps:
applying data to be stored in the buffer memory as a plurality of data words to a generator matrix to generate a set of parity check bits for all the data words, the generator matrix comprising a data portion and a parity check generation portion;
the parity check generation portion comprises rows of bits corresponding to binary representations of the respective data buffer locations to be used to store the data;
storing all of the data words in the buffer memory at the data buffer locations; and
storing the set of parity check bits in the buffer memory in one or more parity check buffer locations that are different than the data buffer locations that contain the data.

25. An apparatus comprising:
a controller coupled to a storage medium; and
a buffer memory coupled to the controller for storing data to be written to the storage medium and data read from the storage medium;
wherein the controller is operable to perform the following steps:
applying data to be stored in a buffer memory as a plurality of data words to a generator matrix to generate a set of parity check bits;
storing all of the data words in respective data buffer memory locations and the set parity check bits in one or more parity check buffer locations that are different locations than the data buffer locations that contain the data;

reading all of the stored data words and the set of parity check bits;

regenerating the set of parity check bits for all of the data words; and producing from all of the stored data words and the set of regenerated parity check bits a result that is usable to directly identify:
  i. a data buffer location of a data word that contains an erroneous bit and
  ii. the position of the erroneous bit in the data word.

26. An apparatus comprising:

a controller coupled to a storage medium; and a buffer memory coupled to the controller for storing a plurality of data words to be written to the storage medium and read from the storage medium;

wherein the controller is operable to perform the following steps:
  applying all of the data words to be stored in a plurality of addressable data buffer locations in the buffer memory to a generator matrix to generate a set of parity check bits, the generator matrix comprising a data portion and a parity check generation portion;
  wherein the parity check generation portion comprises rows of bits corresponding to binary representations of the data buffer locations to be used to store all of the data words;
  storing all of the data words in the buffer memory at the addressable data buffer locations; and
  storing the set of parity check bits in the buffer memory in one or more addressable parity check buffer locations that have are different addresses than the data buffer locations that contain all of the data words.

27. An apparatus comprising:

a controller coupled to a storage medium; and a buffer memory coupled to the controller for storing a plurality of data words to be written to the storage medium and read from the storage medium, the buffer memory including separately addressable multiple symbol storage locations;

wherein the controller is operable to perform the following steps:
  applying all of the data words to a generator matrix to generate a set of parity check bits, the generator matrix including a parity check generation portion that includes rows of bits that correspond to the addressable storage locations to be used to store the data;
  storing all of the data words in the corresponding addressable storage locations as a plurality of data words;
  storing the set of parity check bits generated by the generator matrix in storage locations that are addressable separately from the storage locations in which the data words are stored;
  retrieving all of the data words and the set of parity check bits from their respective storage locations and regenerating the set of parity check bits; and
  producing from the stored and regenerated parity check bits a result that is usable to directly identify:
    i. the addressable storage location that contains a data word with an erroneous bit, and
    ii. the position of the erroneous bit in the data word contained in the identified storage location.

* * * * *